(12) United States Patent
Shinno et al.

(10) Patent No.: US 11,339,465 B2
(45) Date of Patent: May 24, 2022

(54) VAPOR DEPOSITION MASK SUBSTRATE, VAPOR DEPOSITION MASK SUBSTRATE MANUFACTURING METHOD, VAPOR DEPOSITION MASK MANUFACTURING METHOD, AND DISPLAY DEVICE MANUFACTURING METHOD

(71) Applicant: TOPPAN PRINTING CO., LTD., Tokyo (JP)

(72) Inventors: Mikio Shinno, Tokyo (JP); Reiji Terada, Tokyo (JP); Kiyoaki Nishitsuji, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 415 days.

(21) Appl. No.: 16/019,277

(22) Filed: Jun. 26, 2018

(65) Prior Publication Data
US 2019/0078194 A1 Mar. 14, 2019

(30) Foreign Application Priority Data
Sep. 8, 2017 (JP) .............................. JP2017-173153

(51) Int. Cl.
*C23C 14/04* (2006.01)
*C23F 1/02* (2006.01)
(Continued)

(52) U.S. Cl.
CPC .............. *C23C 14/042* (2013.01); *C23F 1/02* (2013.01); *H01L 51/0011* (2013.01); *H01L 51/56* (2013.01)

(58) Field of Classification Search
None
See application file for complete search history.

(56) References Cited

U.S. PATENT DOCUMENTS 10,697,069 B2    6/2020    Shinno
10,767,266 B2    9/2020    Shinno et al.
(Continued)

FOREIGN PATENT DOCUMENTS

CN    1534383 A    10/2004
CN    102851638 A    1/2013
(Continued)

OTHER PUBLICATIONS

Non-Final Office Action dated Jul. 16, 2019, in U.S. Appl. No. 15/928,357, 11 pages.
(Continued)

*Primary Examiner* — Michael B Cleveland
*Assistant Examiner* — Michael G Miller
(74) *Attorney, Agent, or Firm* — Squire Patton Boggs (US) LLP

(57) ABSTRACT

The percentage of a height of each undulation with respect to a length of the undulation is a unit steepness. A steepness is an average value of unit steepnesses of all undulations in a longitudinal direction at each of different positions in a width direction of a metal sheet. The maximum value of steepnesses in a center section in the width direction is less than or equal to 0.3%. The maximum value of steepnesses in a first edge in the width direction and a maximum value of steepnesses in a second edge section in the width direction are less than or equal to 0.6%. The maximum value of steepnesses in at least one of the first edge section and the second edge section in the width direction is less than the maximum value of steepnesses in the center section in the width direction.

6 Claims, 13 Drawing Sheets

(51) Int. Cl.
H01L 51/00 (2006.01)
H01L 51/56 (2006.01)

(56) References Cited

U.S. PATENT DOCUMENTS

| | | |
|---|---|---|
| 2004/0202821 A1 | 10/2004 | Kim et al. |
| 2006/0103289 A1 | 5/2006 | Kim et al. |
| 2013/0040047 A1 | 2/2013 | Karaki |
| 2014/0377903 A1 | 12/2014 | Takeda et al. |
| 2015/0290667 A1 | 10/2015 | Mizumura |
| 2016/0208392 A1* | 7/2016 | Ikenaga ............... C23C 14/021 |
| 2016/0237546 A1 | 8/2016 | Ikenaga et al. |
| 2016/0315286 A1 | 10/2016 | Kuroki et al. |
| 2017/0092862 A1 | 3/2017 | Obata et al. |
| 2018/0312979 A1 | 11/2018 | Shinno et al. |
| 2019/0071758 A1 | 3/2019 | Okamoto |
| 2019/0112699 A1 | 4/2019 | Shinno |
| 2019/0112715 A1 | 4/2019 | Shinno |
| 2020/0362464 A1 | 11/2020 | Shinno |
| 2020/0362465 A1 | 11/2020 | Shinno et al. |

FOREIGN PATENT DOCUMENTS

| | | |
|---|---|---|
| CN | 104854254 A | 8/2015 |
| CN | 105492654 A | 4/2016 |
| CN | 107849682 A | 3/2018 |
| JP | H11-229040 A | 8/1999 |
| JP | 2005-158319 A | 6/2005 |
| JP | 2006-331973 A | 12/2006 |
| JP | 2009-299170 | 12/2009 |
| JP | 2010-214447 A | 9/2010 |
| JP | 2014-148743 A | 8/2014 |
| JP | 2015-055007 A | 3/2015 |
| JP | 2015-193871 A | 11/2015 |
| JP | 2016-000840 A | 1/2016 |
| JP | 2017-064763 A | 4/2017 |
| JP | 2017-064764 A | 4/2017 |
| JP | 6120038 B1 | 4/2017 |
| JP | 2017-088936 A | 5/2017 |
| JP | 2017-181893 A | 10/2017 |
| JP | 2017-181894 A | 10/2017 |
| KR | 10-2015-0103654 A | 9/2015 |
| WO | WO 2014/109393 A1 | 7/2014 |
| WO | WO 2017/179719 A1 | 10/2017 |
| WO | WO2017/154981 A1 | 2/2019 |

OTHER PUBLICATIONS

Non-Final Office Action dated Apr. 27, 2020, in U.S. Appl. No. 15/928,376, 9 pages.
Notification For The Opinion of Examination, Intellectual Property Office Ministry of Economic Affairs, Taiwan Patent Application No. 107136383, with transalation of Taiwan Office Action, 13 pages, dated Aug. 12, 2021.
Kira et al., "Flatness Control System of Cold Rolling Process with Pneumatic Bearing Type Shape Roll", English abstract, 7 pages, Journal of IRI Technologies vol. 48 No. 2 (Jun. 2008), pp. 129-135,.
Kira et al., "Flatness Control System of Cold Rolling Process with Pneumatic Bearing Type Shape Roll", English abstract, 7 pages, Journal of IHI Technologies, vol. 48, No. 2 (Jun. 2008), pp. 129-135,.
Office Action dated Sep. 23, 2019, in related Chinese Patent Application No. 201610561108.7, 18 pages, with its English translation.
Kihara et al., "Recent rolling mills for sheets", Journal of the Japanese Society of Metals, vol. 25, No. 10 (1986), pp. 832-839, with English language translation.
Trial Decision on Appeal against Decision to Reject Application dated Aug. 26, 2019 in Korean Trial No. 2019-1152, 32 pages.
Trial Decision on Appeal against Decision to Reject Application dated Aug. 26, 2019 in Korean Trial No. 2019-1153, 31 pages.
Non-Final Office Action dated Jan. 31, 2022, in U.S. Appl. No. 16/985,229, 15 pages.
International Preliminary Report on Patentability dated Oct. 16, 2018 in International Patent Application No. PCT/JP2017/015357, 7 pages.
Notification of Reason for Refusal issued by the Korean Intellectual Property Office in Korean Application No. 10-2017-7037898 dated May 4, 2018, 18 pages.

* cited by examiner

Fig.8
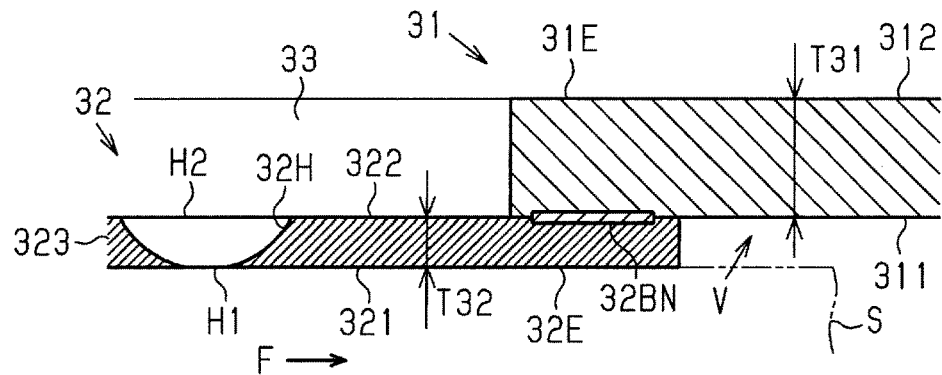
Fig.9
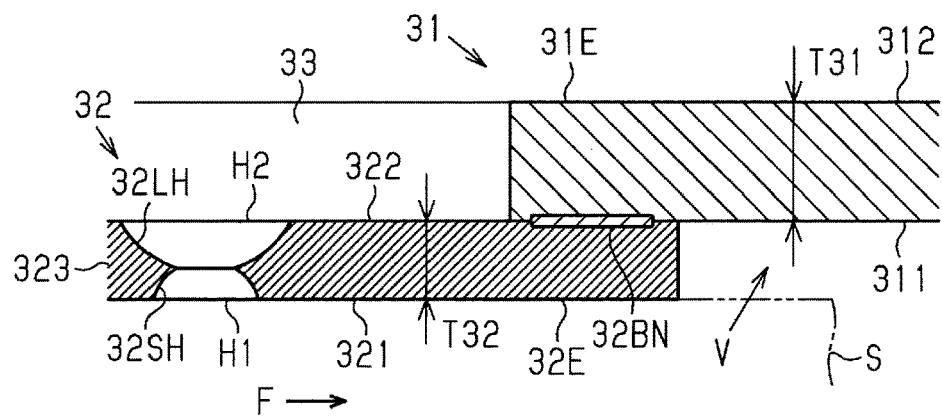
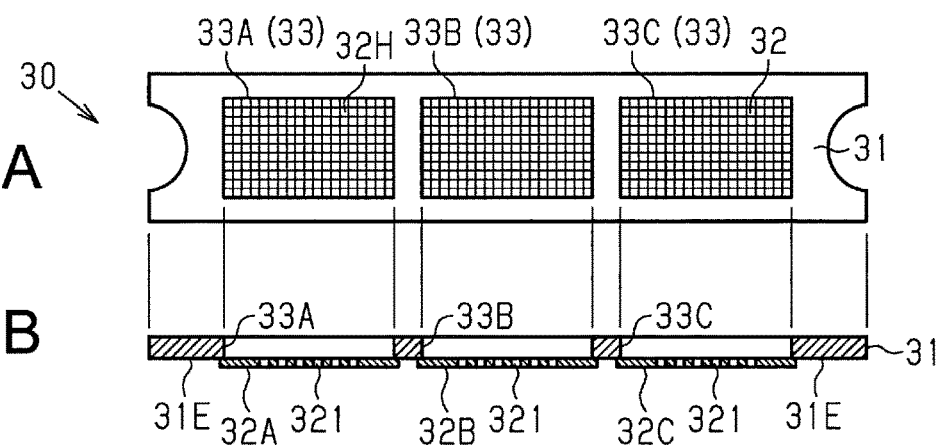
Fig.10A
Fig.10B

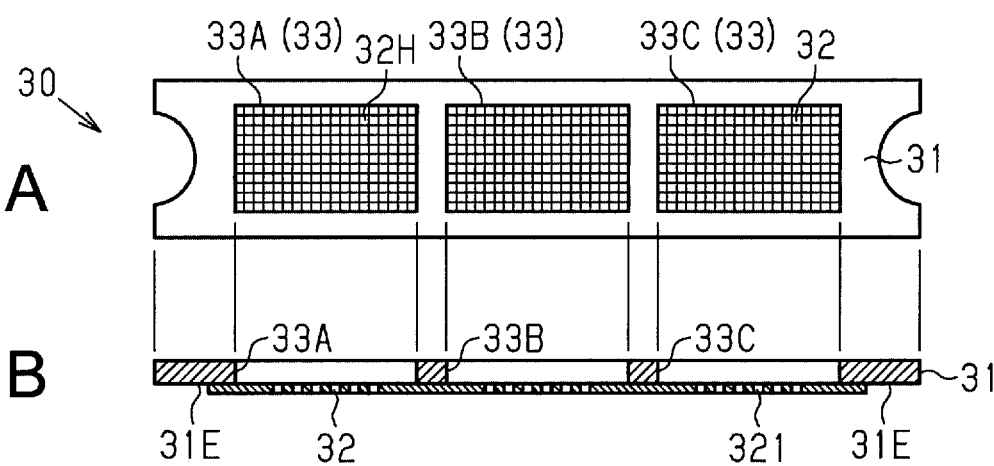

Fig.20A  Sheet preparation 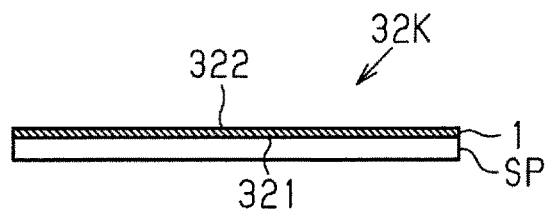
Fig.20B  Resist layer formation 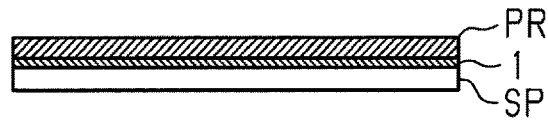
Fig.20C  Exposure and development 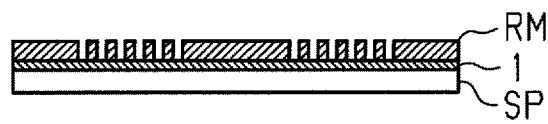
Fig.20D  Etching 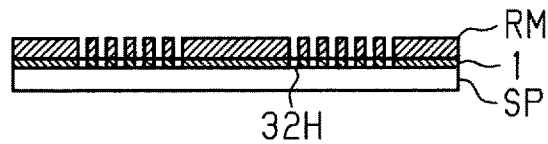
Fig.20E  Resist removal 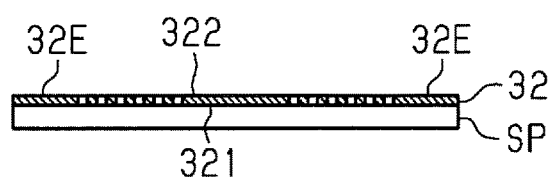
Fig.20F  Joining A 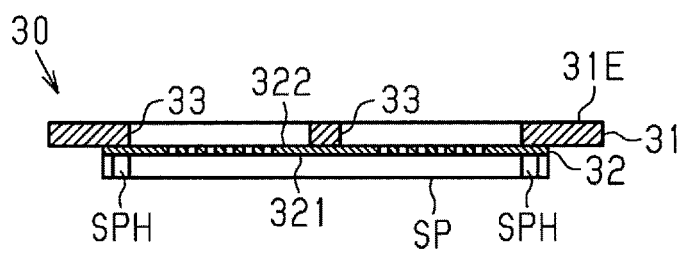
Fig.20G  Joining B 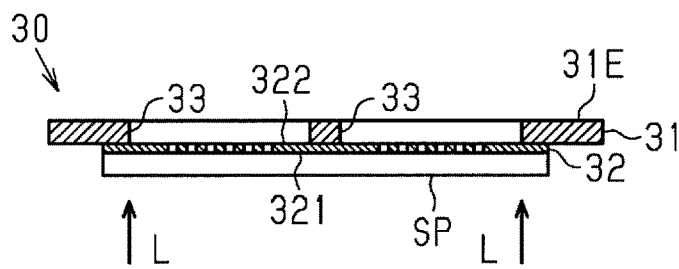
Fig.20H  Joining C 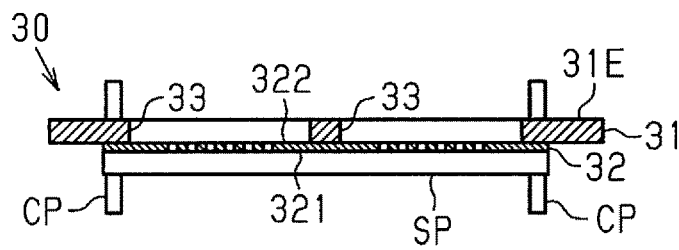

Fig.21A Resist layer formation 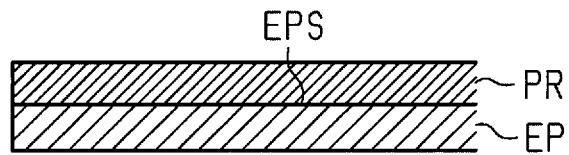
Fig.21B Resist mask formation 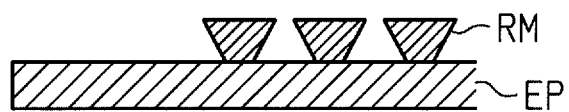
Fig.21C Electrolysis 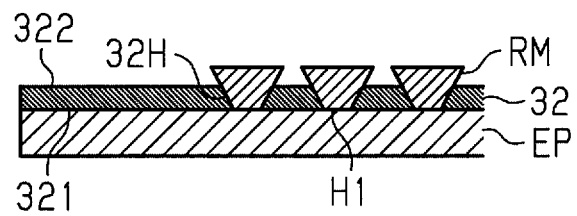
Fig.21D Resist removal 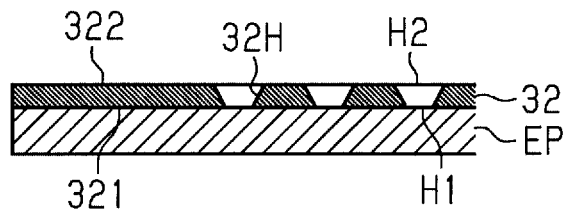
Fig.21E Joining and peeling 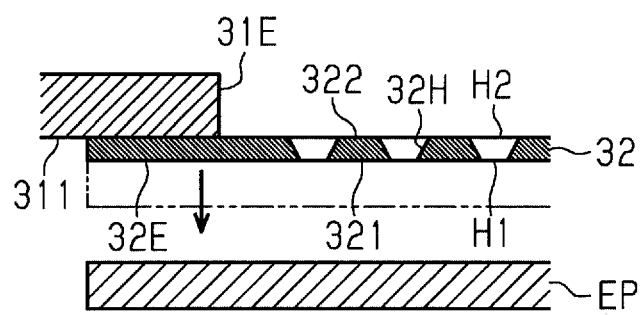

Fig.22A Resist layer formation
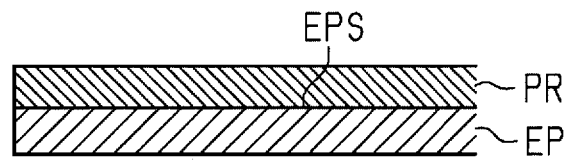
Fig.22B Resist mask formation
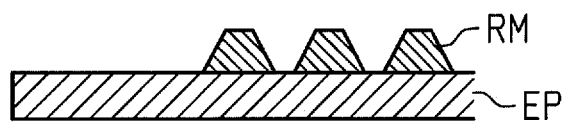
Fig.22C Electrolysis
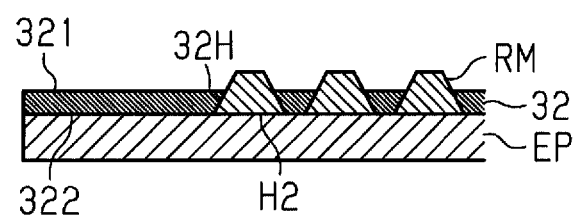
Fig.22D Resist removal
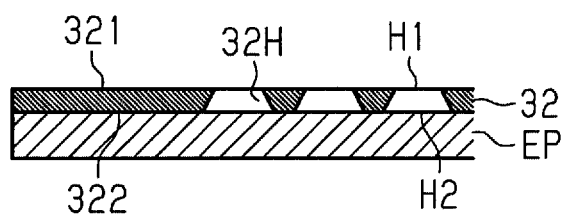
Fig.22E Peeling
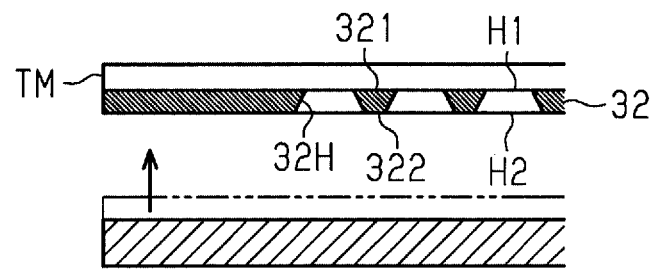
Fig.22F Joining and peeling
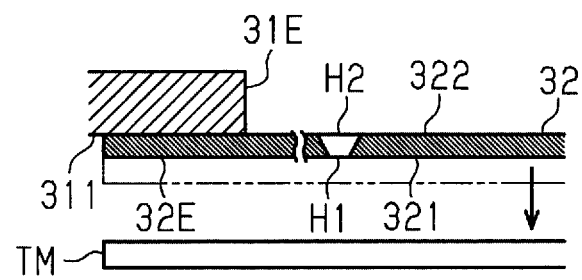

VAPOR DEPOSITION MASK SUBSTRATE, VAPOR DEPOSITION MASK SUBSTRATE MANUFACTURING METHOD, VAPOR DEPOSITION MASK MANUFACTURING METHOD, AND DISPLAY DEVICE MANUFACTURING METHOD

BACKGROUND

The present disclosure relates to a vapor deposition mask substrate, a method for manufacturing a vapor deposition mask substrate, a method for manufacturing a vapor deposition mask, and a method for manufacturing a display device.

A vapor deposition mask includes a first surface, a second surface, and holes extending through the first and second surfaces. The first surface faces a target such as a substrate, and the second surface is opposite to the first surface. The holes each include a first opening, which is located in the first surface, and a second opening, which is located in the second surface. The vapor deposition material entering the holes through the second openings forms on the target a pattern corresponding to the position and shape of the first openings (see Japanese Laid-Open Patent Publication No. 2015-055007, for example).

Each hole of the vapor deposition mask has a cross-sectional area that increases from the first opening toward the second opening. This increases the amount of vapor deposition material entering the hole through the second opening so that an adequate amount of vapor deposition material reaches the first opening. However, at least some of the vapor deposition material entering the hole through the second opening adheres to the wall surface defining the hole, failing to reach the first opening. The vapor deposition material adhering to the wall surface may prevent other vapor deposition material from passing through the hole, lowering the dimensional accuracy of the pattern.

To reduce the volume of vapor deposition material adhering to the wall surfaces, a structure has been contemplated in which the thickness of the vapor deposition mask is reduced to reduce the areas of the wall surfaces. In order to reduce the thickness of the vapor deposition mask, a technique has been contemplated that reduces the thickness of the metal sheet used as the substrate for manufacturing the vapor deposition mask.

However, in the process of etching the metal sheet to form holes, a smaller thickness of the metal sheet results in a smaller volume of metal to be removed. This narrows the permissible ranges in the processing conditions, such as the duration for which etchant is supplied to the metal sheet and the temperature of the supplied etchant. This increases the difficulty in achieving the required dimensional accuracy of the first and second openings. In particular, the manufacturing of metal sheet involves a rolling step, in which the base material is drawn with rolls, or an electrolysis step, in which the metal sheet deposited on an electrode is peeled off from the electrode. Accordingly, the metal sheet has an undulated shape. In the metal sheet having such a shape, the duration for which the ridges in the undulated shape are in contact with the etchant differs greatly from that of the valleys of the undulated shape. This aggravates the reduced accuracy resulting from the narrowed permissible ranges described above. As such, although a thinner vapor deposition mask reduces the amount of vapor deposition material adhering to the wall surfaces and thereby increases the dimensional accuracy of the patterns in repeated vapor deposition, such a vapor deposition mask involves another problem that the required dimensional accuracy of the pattern in each vapor deposition is difficult to achieve.

SUMMARY

It is an objective of the present disclosure to provide a vapor deposition mask substrate, a method for manufacturing a vapor deposition mask substrate, a method for manufacturing a vapor deposition mask, and a method for manufacturing a display device that increase the accuracy of the patterns formed by vapor deposition.

In accordance with one aspect of the present disclosure, a vapor deposition mask substrate is provided, which is a metal sheet that has a shape of a strip and is configured to be etched to include a plurality of holes and used to manufacture a vapor deposition mask. The metal sheet has a longitudinal direction and a width direction. The metal sheet has shapes in the longitudinal direction that are taken at different positions in the width direction of the metal sheet and differ from one another. Each shape includes undulations repeating in the longitudinal direction. Each undulation includes a valley at each end of the undulation. Each undulation has a length, which is a length of a straight line that connects one of the valleys of the undulation to the other. A percentage of a height of each undulation with respect to the length of the undulation is a unit steepness. A steepness is an average value of unit steepnesses of all undulations in the longitudinal direction at each of the different positions in the width direction of the metal sheet. A maximum value of steepnesses in a center section in the width direction is less than or equal to 0.3%. A maximum value of steepnesses in a first edge section in the width direction and a maximum value of steepnesses in a second edge section in the width direction are less than or equal to 0.6%. A maximum value of steepnesses in at least one of the first edge section and the second edge section in the width direction is less than the maximum value of steepnesses in the center section in the width direction.

In accordance with another aspect, a method for manufacturing a vapor deposition mask substrate is provided. The vapor deposition mask substrate is a metal sheet that has a shape of a strip and is configured to be etched to include a plurality of holes and used to manufacture a vapor deposition mask. The method includes obtaining the metal sheet by rolling a base material. The obtained metal sheet has a longitudinal direction and a width direction. The obtained metal sheet has shapes in the longitudinal direction that are taken at different positions in the width direction and differ from one another. Each shape includes undulations repeating in the longitudinal direction. Each undulation includes a valley at each end of the undulation. Each undulation has a length, which is a length of a straight line that connects one of the valleys of the undulation to the other. A percentage of a height of each undulation with respect to the length of the undulation is a unit steepness. A steepness is an average value of unit steepnesses of all undulations in the longitudinal direction at each of the different positions in the width direction of the obtained metal sheet. A maximum value of steepnesses in a center section in the width direction is less than or equal to 0.3%. A maximum value of steepnesses in a first edge section in the width direction and a maximum value of steepnesses in a second edge section in the width direction are less than or equal to 0.6%. A maximum value of steepnesses in at least one of the first edge section and the second edge section in the width direction is less than the maximum value of steepnesses in the center section in the width direction.

In accordance with another aspect, a method for manufacturing a vapor deposition mask is provided. The method includes: forming a resist layer on a metal sheet having a shape of a strip; and forming a plurality of holes in the metal sheet by etching using the resist layer as a mask to form a mask portion in the metal sheet. The metal sheet has a longitudinal direction and a width direction. The metal sheet has shapes in the longitudinal direction that are taken at different positions in the width direction and differ from one another. Each shape includes undulations repeating in the longitudinal direction. Each undulation includes a valley at each end of the undulation. Each undulation has a length, which is a length of a straight line that connects one of the valleys of the undulation to the other. A percentage of a height of each undulation with respect to the length of the undulation is a unit steepness. A steepness is an average value of unit steepnesses of all undulations in the longitudinal direction at each of the different positions in the width direction of the metal sheet. A maximum value of steepnesses in a center section in the width direction is less than or equal to 0.3%. A maximum value of steepnesses in each edge section in the width direction is less than or equal to 0.6%. A maximum value of steepnesses in at least one of a first edge section and a second edge section in the width direction is less than the maximum value of steepnesses in the center section in the width direction.

In accordance with yet another aspect, a method for manufacturing a display device is provided. The method includes: preparing a vapor deposition mask manufactured by the above-described; and forming a pattern by vapor deposition using the vapor deposition mask.

BRIEF DESCRIPTION OF THE DRAWINGS

The features of the present disclosure that are believed to be novel are set forth with particularity in the appended claims. The disclosure, together with objects and advantages thereof, may best be understood by reference to the following description of the presently preferred embodiments together with the accompanying drawings in which:

FIG. 8 is a partial cross-sectional view showing an example of the structure of joining between an edge of a mask portion and a frame portion;

FIG. 9 is a partial cross-sectional view showing another example of the structure of joining between an edge of a mask portion and a frame portion;

FIG. 10A is a plan view showing an example of the planar structure of a vapor deposition mask;

FIG. 10B is a cross-sectional view showing an example of the cross-sectional structure of the vapor deposition mask;

FIG. 11A is a plan view showing another example of the planar structure of a vapor deposition mask;

FIG. 11B is a cross-sectional view showing another example of the cross-sectional structure of the vapor deposition mask;

FIGS. 20A to 20H are process diagrams for illustrating an example of a method for manufacturing a vapor deposition mask;

FIGS. 21A to 21E are process diagrams for illustrating an example of a method for manufacturing a vapor deposition mask;

FIGS. 22A to 22F are process diagrams for illustrating an example of a method for manufacturing a vapor deposition mask;

DETAILED DESCRIPTION

Referring to FIGS. 1 to 29, embodiments of a vapor deposition mask substrate, a method for manufacturing a vapor deposition mask substrate, a method for manufacturing a vapor deposition mask, and a method for manufacturing a display device are now described.

[Structure of Vapor Deposition Mask Substrate]

Figure 1:
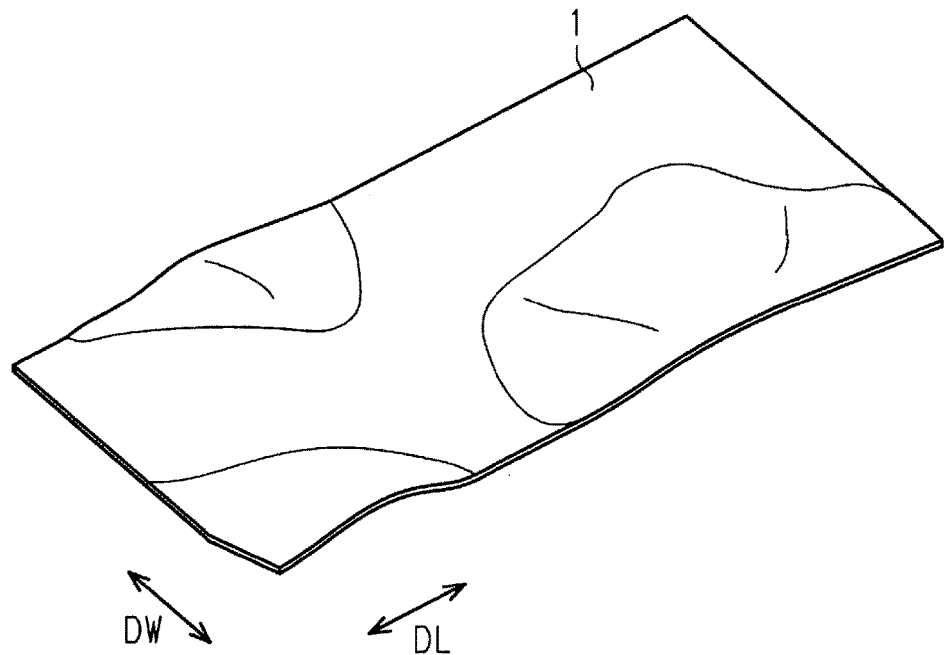
FIG. 1 is a perspective view showing a vapor deposition mask substrate.

As shown in FIG. 1, a vapor deposition mask substrate 1 is a metal sheet having the shape of a strip. The vapor deposition mask substrate 1 has an undulated shape in which undulations are repeated in the longitudinal direction DL at each of the different positions in the width direction DW, which is the transverse direction. The undulated shapes at different positions in the width direction DW of the vapor deposition mask substrate 1 differ from one another. The different undulated shapes differ in characteristics such as the number of undulations, the length of undulation, and the height of undulations in the undulated shapes. For illustrative purposes, the shapes of the vapor deposition mask substrate 1 are exaggerated in FIG. 1. The thickness of the vapor deposition mask substrate 1 is between 15 μm and 50 μm inclusive. The uniformity in thickness of the vapor deposition mask substrate 1 is such that the ratio of the difference between the maximum thickness and the minimum thickness to the average thickness is less than or equal to 5%, for example.

The vapor deposition mask substrate 1 may be made of nickel or a nickel-iron alloy, such as a nickel-iron alloy containing at least 30 mass % of nickel. In particular, the vapor deposition mask substrate 1 may be made of Invar, which is mainly composed of an alloy containing 36 mass % of nickel and 64 mass % of iron. When the main component is the alloy of 36 mass % of nickel and 64 mass % of iron, the remainder contains additives such as chromium, manganese, carbon, and cobalt. When the vapor deposition mask substrate 1 is made of Invar, the vapor deposition mask substrate 1 has a thermal expansion coefficient of about $1.2 \times 10^{-6}/°C$. The vapor deposition mask substrate 1 having such a thermal expansion coefficient produces a mask that changes its size due to thermal expansion to an extent equivalent to that of a glass substrate and a polyimide sheet. Thus, a glass substrate or a polyimide sheet is suitably used as a vapor deposition target.

[Steepness]

When the vapor deposition mask substrate 1 is placed on a level surface, the position (height) of the surface of the vapor deposition mask substrate 1 with respect to the level surface is referred to as the surface position.

Figure 2:
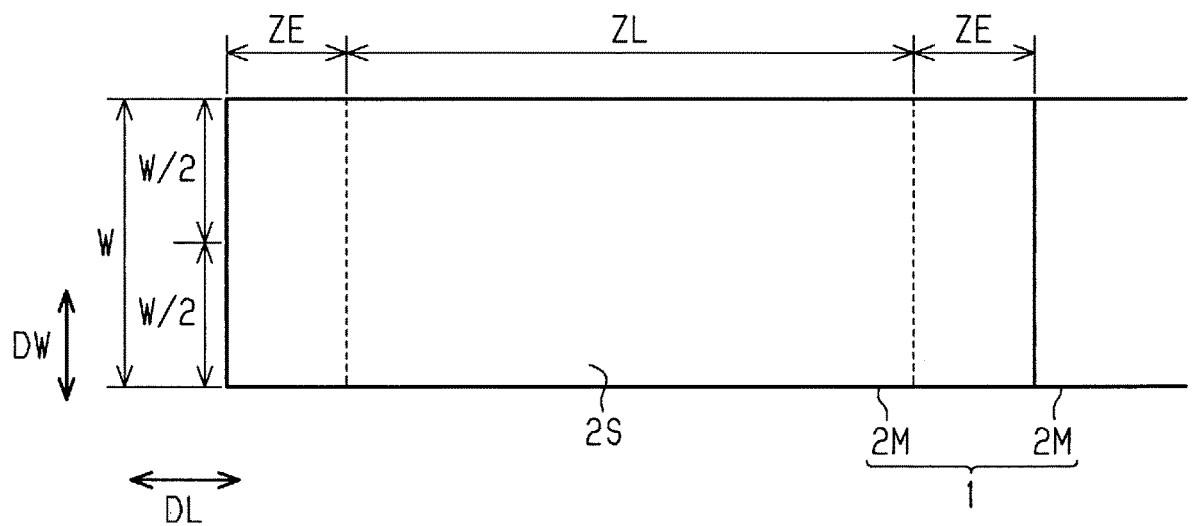
FIG. 2 is a plan view showing a measurement substrate.

As shown in FIG. 2, to measure the surface position, a slitting step is first performed in which the vapor deposition mask substrate 1 is cut across in the width direction DW (cut across the width) so that a measurement substrate 2M is cut out as a section of the vapor deposition mask substrate 1 in the longitudinal direction DL of the vapor deposition mask substrate 1. The dimension W in the width direction DW of the measurement substrate 2M is equal to the dimension in the width direction DW of the vapor deposition mask substrate 1. Then, the surface position of the surface 2S of the measurement substrate 2M is measured at different positions in the length direction DL and at predetermined intervals in the width direction DW. The area in which the surface position is measured is the measurement area ZL. The measurement area ZL is an area that excludes the non-measurement areas ZE located at the two edges in the longitudinal direction DL of the measurement substrate 2M. The slitting step for cutting the vapor deposition mask substrate 1 may give the measurement substrate a new undulated shape that differs from the undulated shape of the vapor deposition mask substrate 1. The length in the longitudinal direction DL of each non-measurement area ZE corresponds to the area in which such a new undulated shape can be formed, and the non-measurement areas ZE are excluded from the measurement of surface positions. The length in the longitudinal direction DL of each non-measurement area ZE is 100 mm, for example.

Figure 3:
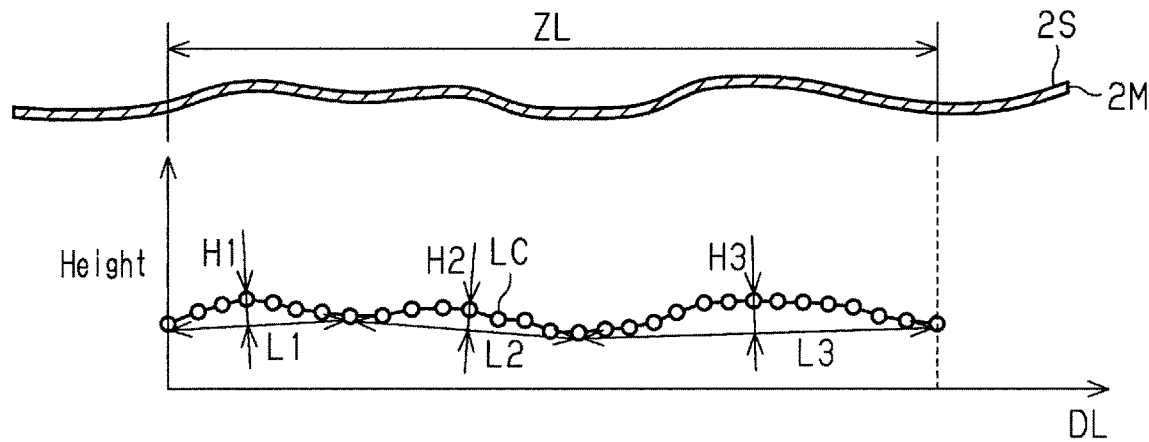
FIG. 3 is a diagram showing a graph for illustrating steepness together with the cross-sectional structure of a measurement substrate.

FIG. 3 is a graph showing an example of the surface position at different positions in the longitudinal direction DL of the measurement substrate 2M together with the cross-sectional structure of a cross-section taken in the longitudinal direction DL of the measurement substrate 2M. FIG. 3 shows an example of one of the different sections in the width direction DW. This section has three undulations in the longitudinal direction DL.

As shown in FIG. 3, the different positions in the longitudinal direction DL at which surface positions are measured are set at intervals that enable representation of the undulated shape of the vapor deposition mask substrate 1. The positions in the longitudinal direction DL at which surface position are measured are at intervals of 1 mm in the longitudinal direction DL, for example. The line LC connecting the surface positions at different positions in the longitudinal direction DL is considered as a line extending along the surface of the vapor deposition mask substrate 1. The length of the line LC is the distance along the surface of the vapor deposition mask substrate 1. The undulations in the line LC each have an undulation length L1, L2 or L3, which is the length of the straight line connecting one of the valleys of the undulation to the other, that is, the distance between one of the valleys of the undulation to the other. The undulations in the line LC each have an undulation height H1, H2 or H3, which is the height with respect to the straight line connecting one valley to the other of the undulation. A unit steepness of the vapor deposition mask substrate 1 is a percentage of the height of an undulation with respect to the length of the undulation. In the example in FIG. 3, the unit steepnesses are the height H1/length L1×100(%), the height H2/length L2×100(%), and height H3/length L3×100(%). The steepness of the vapor deposition mask substrate 1 is the average value of the unit steepnesses of all undulations in the longitudinal direction DL at each position in the width direction DW. In the example in FIG. 3, the steepness of the vapor deposition mask substrate 1 is the average value of the height H1/length L1×100(%), the height H2/length L2×100 (%), and height H3/length L3×100(%).

Figure 4:
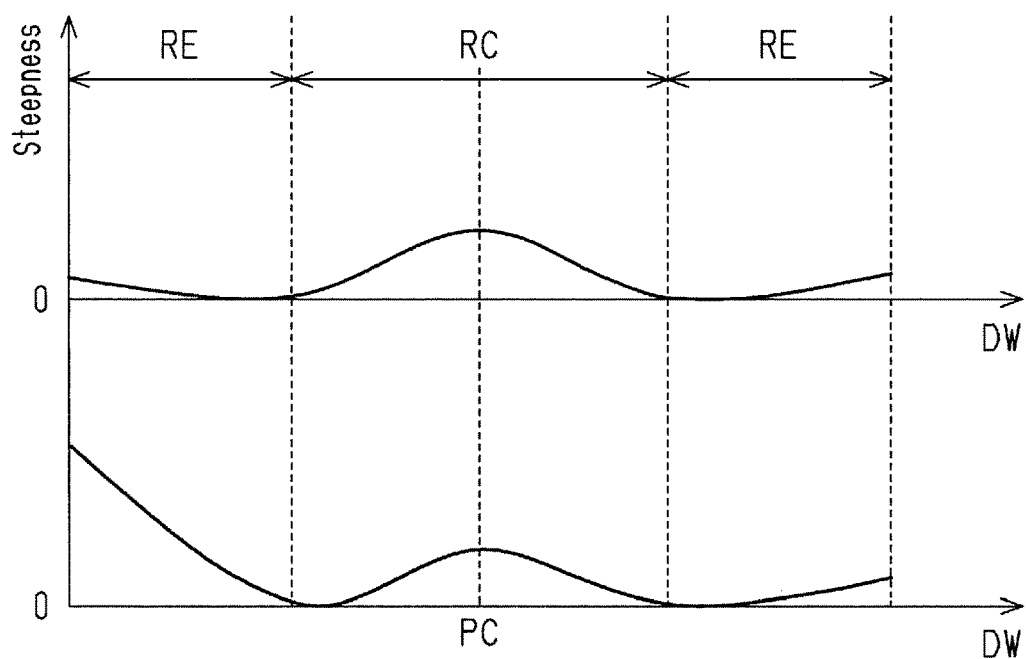
FIG. 4 is a graph for illustrating steepnesses.

FIG. 4 shows the steepnesses at different positions in the width direction DW of the vapor deposition mask substrate 1. The upper solid line in FIG. 4 shows an example in which the center section RC in the width direction DW has a steepness that is greater than the steepnesses in the two edge sections RE. The lower solid line in FIG. 4 shows an example in which one of the edge sections RE in the width direction DW has a steepness that is greater than the steepnesses in the center section RC and the other edge section RE. One of the edge sections RE is an example of a first edge section, and the other edge section RE is an example of a second edge section.

As shown in FIG. 4, the greatest steepness of the vapor deposition mask substrate 1 is measured in the center section RC in the width direction DW, while the smallest steepness is measured near the boundaries between the center section RC and the edge sections RE. The steepnesses of the vapor deposition mask substrate 1 increase from the center section RC toward the edges of the two edge sections RE in the width direction DW. The center in the width direction DW of the center section RC is the center PC in the width direction DW of the vapor deposition mask substrate 1. The length in the width direction DW of the center section RC in the width direction DW is 40% of the length in the width direction DW of the vapor deposition mask substrate 1. The length in the width direction DW of each edge section RE in the width direction DW is 30% of the length in the width direction DW of the vapor deposition mask substrate 1. The steepnesses of this vapor deposition mask substrate 1 satisfy the following three conditions.

[Condition 1] The maximum value of the steepnesses in the center section RC in the width direction DW is less than or equal to 0.3%.

[Condition 2] The maximum values of the steepnesses in the edge sections RE in the width direction DW are less than or equal to 0.6%.

[Condition 3] The maximum value of the steepnesses in at least one of the edge sections RE in the width direction DW is less than the maximum value of the steepnesses in the center section RC in the width direction DW.

As indicated by the upper solid line in FIG. 4, in an example satisfying Condition 3, the maximum values of the steepnesses in the edge sections RE are less than the maximum value of the steepnesses in the center section RC. That is, in this vapor deposition mask substrate 1, the center section RC has steeper surface undulations than the edge sections RE. This vapor deposition mask substrate 1 allows the liquid supplied to the surface of the vapor deposition mask substrate 1 to flow easily from the center section RC to the edge sections RE and also from the edge sections RE to the outside of the vapor deposition mask substrate 1.

As indicated by the lower solid line in FIG. 4, in another example satisfying Condition 3, the maximum value of the steepnesses in one of the edge sections RE is less than the maximum value of the steepnesses in the center section RC, and the maximum value of the steepnesses in the other edge section RE is greater than the maximum value of the steepnesses in the center section RC. That is, in this vapor deposition mask substrate 1, one of the edge sections RE has gentler surface undulations than the center section RC, and the other edge section RE has steeper surface undulations than the center section RC. This vapor deposition mask substrate 1 allows the liquid supplied to the surface of the vapor deposition mask substrate 1 to flow easily from the second edge section RE to the first edge section RE and also from the first edge section RE to the outside of the vapor deposition mask substrate 1.

The liquid supplied to the surface of the vapor deposition mask substrate 1 may be developing solution for developing the resist layer on the surface of the vapor deposition mask substrate 1 and cleaning solution for removing the developing solution from the surface. The liquid supplied to the surface of the vapor deposition mask substrate 1 may also be etchant for etching the vapor deposition mask substrate 1 and cleaning solution for removing the etchant from the surface. Further, the liquid supplied to the surface of the vapor deposition mask substrate 1 may be stripping solution for stripping the resist layer remaining on the surface of the vapor deposition mask substrate 1 after etching, and cleaning solution for removing the stripping solution from the surface.

The structures described above, in which the flow of liquid supplied to the surface of the vapor deposition mask substrate 1 is unlikely to stagnate, increase the uniformity of the processing using liquid on the surface of the vapor deposition mask substrate 1. Further, when the center section RC satisfies Condition 1, so that the surface of the center section RC is free of excessively steep undulations, and the edge sections RE satisfy Condition 2, so that the surfaces of the edge sections RE are free of excessively steep undulations, the structure improves the adhesion between the resist layer and the vapor deposition mask substrate 1 and increases the accuracy of exposure to the resist layer. Moreover, the structure that satisfies Conditions 1 and 2 limits deviations in transfer in the roll-to-roll processing of the vapor deposition mask substrate 1, in addition to limiting stagnation of a flow of liquid. This further improves the uniformity of processing.

In an example that does not satisfy Condition 3, the maximum values of the steepnesses in the edge sections RE are greater than or equal to the maximum value of the steepnesses in the center section RC. That is, the surface undulations in the edge sections RE are steeper than the surface undulations in the center section RC. This vapor deposition mask substrate 1 allows the liquid supplied to the surface of the vapor deposition mask substrate 1 to flow easily from the edge sections RE to the outside of the vapor deposition mask substrate 1 and also from the edge sections RE to the center section RC. This tends to create liquid pools in the center section RC, which may reduce the uniformity of the processing using liquid on the surface of the vapor deposition mask substrate 1. As such, the structure satisfying Condition 3 and the advantages of this structure are achievable only by identifying the problem in surface processing using liquid that occurs due to the difference between the steepnesses in the center section RC and the steepnesses in the edge sections RE.

[Structure of Mask Device]

Figure 5:
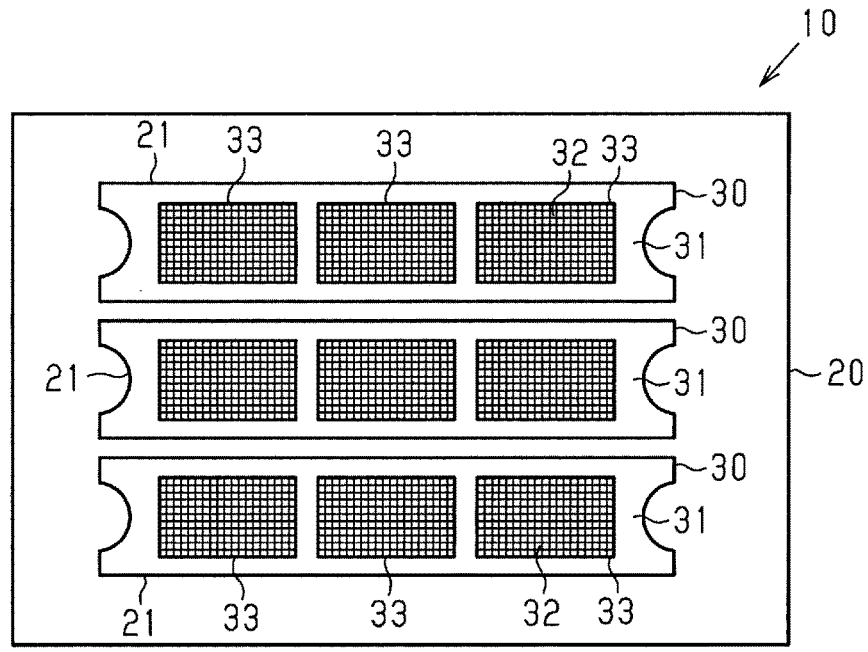
FIG. 5 is a plan view showing the planar structure of a mask device.
Figure 6:
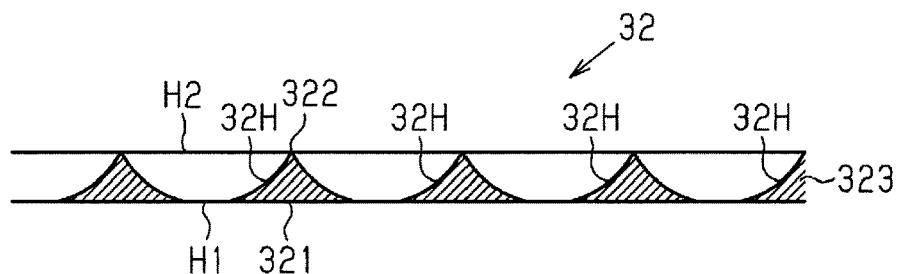
FIG. 6 is a partial cross-sectional view showing an example of the cross-sectional structure of a mask portion.
Figure 7:
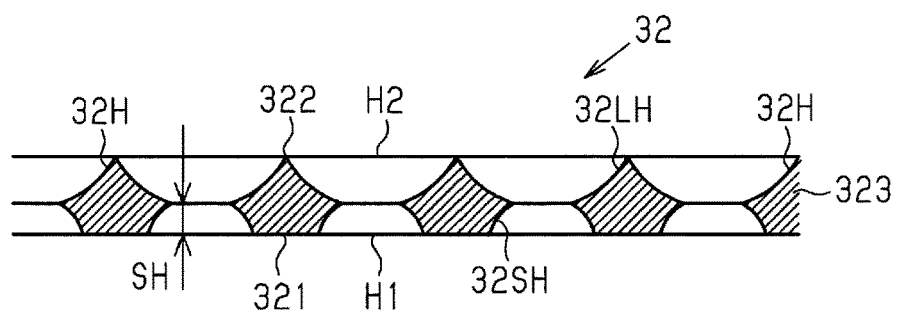
FIG. 7 is a partial cross-sectional view showing another example of the cross-sectional structure of a mask portion.

FIG. 5 schematically shows the planar structure of a mask device including a vapor deposition mask manufactured using the vapor deposition mask substrate 1. FIG. 6 shows an example of the cross-sectional structure of a mask portion of a vapor deposition mask. FIG. 7 shows another example of the cross-sectional structure of a mask portion of a vapor deposition mask. The number of the vapor deposition masks in the mask device and the number of mask portions in a vapor deposition mask 30 shown are by way of example.

As shown in FIG. 5, a mask device 10 includes a main frame 20 and three vapor deposition masks 30. The main frame 20 has the shape of a rectangular frame and supports the vapor deposition masks 30. The main frame 20 is attached to a vapor deposition apparatus that performs vapor deposition. The main frame 20 includes main frame holes 21, which extend through the main frame 20 and extend substantially over the entire areas in which the vapor deposition masks 30 are placed.

The vapor deposition masks 30 include a plurality of frame portions 31, each having the shape of a planar strip, and three mask portions 32 in each frame portion 31. Each frame portion 31, which supports mask portions 32 and has the shape of a planar strip, is attached to the main frame 20. Each frame portion 31 includes frame holes 33, which extend through the frame portion 31 and extend substantially over the entire areas in which mask portions 32 are placed. The frame portion 31 has a higher rigidity than the mask portions 32 and is shaped as a frame surrounding the frame holes 33. The mask portions 32 are separately fixed by welding or adhesion to the frame inner edge sections of the frame portion 31 defining the frame holes 33.

As shown in FIG. 6, an example of a mask portion 32 is made of a mask plate 323. The mask plate 323 may be a single planar member made of a vapor deposition mask substrate 1 or a laminate of a single planar member made of a vapor deposition mask substrate 1 and a plastic sheet. FIG. 6 shows a single planar member made of the vapor deposition mask substrate 1.

The mask plate 323 includes a first surface 321 (the lower surface in FIG. 6) and a second surface 322 (the upper surface in FIG. 6), which is opposite to the first surface 321. The first surface 321 faces the vapor deposition target, such as a glass substrate, when the mask device 10 is attached to a vapor deposition apparatus. The second surface 322 faces the vapor deposition source of the vapor deposition apparatus. The mask portion 32 includes a plurality of holes 32H extending through the mask plate 323. The wall surface defining each hole 32H is inclined with respect to the thickness direction of the mask plate 323 in a cross-sectional view. In a cross-sectional view, the wall surface defining each hole 32H may have a semicircular shape protruding outward of the hole 32H as shown in FIG. 6, or a complex curved shape having a plurality of bend points.

The mask plate 323 has a thickness of between 1 µm and 50 µm inclusive, preferably between 2 µm and 20 µm inclusive. The thickness of the mask plate 323 that is less than or equal to 50 µm allows the holes 32H formed in the mask plate 323 to have a depth of less than or equal to 50 µm. This thin mask plate 323 allows the wall surfaces defining the holes 32H to have small areas, thereby reducing the volume of vapor deposition material adhering to the wall surfaces defining the holes 32H.

The second surface 322 includes second openings H2, which are openings of the holes 32H. The first surface 321 includes first openings H1, which are openings of the holes 32H. The second openings H2 are larger than the first openings H1 in a plan view. Each mask hole 32H is a passage for the vapor deposition particles sublimated from the vapor deposition source. The vapor deposition material sublimated from the vapor deposition source moves from the second openings H2 to the first openings H1. The second openings H2 that are larger than the first openings H1 increase the amount of vapor deposition material entering the holes 32H through the second openings H2. The area of each hole 32H in a cross-section taken along the first surface 321 may increase monotonically from the first opening H1 toward the second opening H2, or may be substantially uniform in a section between the first opening H1 and the second opening H2.

As shown in FIG. 7, another example of a mask portion 32 includes a plurality of holes 32H extending through the mask plate 323. The second openings H2 are larger than the first openings H1 in a plan view. Each hole 32H consists of a large hole 32LH, which includes a second opening H2, and a small hole 32SH, which includes a first opening H1. The large hole 32LH has a cross-sectional area that monotonically decreases from the second opening H2 toward the first surface 321. The small hole 32SH has a cross-sectional area that monotonically decreases from the first opening H1 toward the second surface 322. The section of the wall surface defining each hole 32H where the large hole 32LH meets the small hole 32SH at a middle section in the thickness direction of the mask plate 323 projects inward of the hole 32H. The distance between the first surface 321 and the protruding section of the wall surface defining the hole 32H is a step height SH. The example of cross-sectional structure shown in FIG. 6 has zero step height SH. To increase the amount of vapor deposition material reaching the first openings H1, the step height SH is preferably zero. In order for a mask portion 32 to have zero step height SH, the mask plate 323 should be thin enough so that wet etching from only one side of the vapor deposition mask substrate 1 achieves formation of holes 32H. For example, the mask plate 323 may have a thickness of less than or equal to 50 μm.

[Mask Portion Joining Structure]

FIG. 8 shows an example of the cross-sectional structure of joining between a mask portion 32 and a frame portion 31. FIG. 9 shows another example of the cross-sectional structure of joining between a mask portion 32 and a frame portion 31.

In the example shown in FIG. 8, the outer edge section 32E of a mask plate 323 is a region that is free of holes 32H. The part of the second surface 322 of the mask plate 323 included in the outer edge section 32E of the mask plate 323 is an example of a side surface of the mask portion and joined to the frame portion 31. The frame portion 31 includes inner edge sections 31E defining frame holes 33. Each inner edge section 31E includes a joining surface 311 (the lower surface in FIG. 8), which faces the mask plate 323, and a non-joining surface 312 (the upper surface in FIG. 8), which is opposite to the joining surface 311. The thickness T31 of the inner edge section 31E, that is, the distance between the joining surface 311 and the non-joining surface 312 is sufficiently larger than the thickness T32 of the mask plate 323, allowing the frame portion 31 to have a higher rigidity than the mask plate 323. In particular, the frame portion 31 has a high rigidity that limits sagging of the inner edge section 31E by its own weight and displacement of the inner edge section 31E toward the mask portion 32. The joining surface 311 of the inner edge section 31E includes a joining section 32BN, which is joined to the second surface 322.

The joining section 32BN extends continuously or intermittently along substantially the entire circumference of the inner edge section 31E. The joining section 32BN may be a welding mark formed by welding the joining surface 311 to the second surface 322, or a joining layer joining the joining surface 311 to the second surface 322. When the joining surface 311 of the inner edge section 31E is joined to the second surface 322 of the mask plate 323, the frame portion 31 applies stress F to the mask plate 323 that pulls the mask plate 323 outward.

The main frame 20 also applies stress to the frame portion 31 that pulls the frame portion 31 outward. This stress corresponds to the stress F applied to the mask plate 323. Accordingly, the vapor deposition mask 30 removed from the main frame 20 is released from the stress caused by the joining between the main frame 20 and the frame portion 31, and the stress F applied to the mask plate 323 is relaxed. The position of the joining section 32BN in the joining surface 311 is preferably set such that the stress F isotropically acts on the mask plate 323. Such a position may be selected according to the shape of the mask plate 323 and the shape of the frame holes 33.

The joining surface 311 is a plane including the joining section 32BN and extends outward of the mask plate 323 from the outer edge section 32E of the second surface 322. In other words, the inner edge section 31E has a planar structure that virtually extends the second surface 322 outward, so that the inner edge section 31E extends from the outer edge section 32E of the second surface 322 toward the outside of the mask plate 323. Accordingly, in the area in which the joining surface 311 extends, a space V, which corresponds to the thickness of the mask plate 323, is likely to form around the mask plate 323. This limits physical interference between the vapor deposition target S and the frame portion 31 around the mask plate 323.

FIG. 9 shows another example in which the outer edge section 32E of the second surface 322 includes a region that is free of holes 32H. The outer edge section 32E of the second surface 322 includes a joining section 32BN with which the outer edge section 32E is joined to the joining surface 311 of the frame portion 31. The frame portion 31 applies stress F to the mask plate 323 that pulls the mask plate 323 outward. The frame portion 31 also creates a space V, which corresponds to the thickness of the mask plate 323, in the area where the joining surface 311 extends.

The mask plate 323 that is not subjected to the stress F may have some undulations in a similar manner as the vapor deposition mask substrate 1. The mask plate 323 that is subjected to the stress F, that is, the mask plate 323 mounted to the vapor deposition mask 30, may deform such that the heights of the undulations are reduced. However, any deformation caused by the stress F does not exceed the permissible degree when the vapor deposition mask substrate 1 satisfies Conditions 2 and 3 described above. Accordingly, the holes 32H in the vapor deposition mask 30 are less likely to deform, improving the accuracy of the position and shape of the patterns.

[Quantity of Mask Portions]

FIGS. 10A and 10B show an example of the relationship between the quantity of holes 32H in a vapor deposition mask 30 and the quantity of holes 32H in a mask portion 32. FIGS. 11A and 11B show another example of the relationship between the quantity of holes 32H in a vapor deposition mask 30 and the quantity of holes 32H in a mask portion 32.

FIG. 10A shows an example in which the frame portion 31 includes three frame holes 33 (33A, 33B, and 33C). As shown in FIG. 10B, the vapor deposition mask 30 of this example includes one mask portion 32 (32A, 32B, or 32C) in each of the frame holes 33. The inner edge section 31E defining the frame hole 33A is joined to a mask portion 32A, the inner edge section 31E defining the frame hole 33B is joined to another mask portion 32B, and the inner edge section 31E defining the frame hole 33C is joined to the other mask portion 32C.

The vapor deposition mask 30 is used repeatedly for a plurality of vapor deposition targets. Thus, the position and structure of the holes 32H in the vapor deposition mask 30 need to be highly accurate. When the position and structure of the holes 32H fail to have the desired accuracy, the mask portions 32 may require replacement when manufacturing or repairing the vapor deposition mask 30.

When only one of the mask portions 32 needs to be replaced, for example, the structure in which the quantity of holes 32H required in one frame portion 31 is divided into three mask portions 32 as shown in FIGS. 10A and 10B only requires the replacement of one of the three mask portions 32. In other words, the two of the three mask portions 32 continue to be used. Thus, the structure in which the mask portions 32 are separately joined to the respective frame holes 33 reduces the consumption of various materials associated with the manufacturing and repair of the vapor deposition mask 30. In addition, a thinner mask plate 323 and smaller holes 32H tend to reduce the yield of the mask portion 32 and increase the need for replacement of the mask portion 32. Thus, the structure in which each frame hole 33 has one mask portion 32 is particularly suitable for a vapor deposition mask 30 that requires high resolution.

The position and structure of the holes 32H are preferably determined while the stress F is applied, that is, while the mask portions 32 are joined to the frame portion 31. In this respect, the joining section 32BN preferably extends partly and intermittently along the inner edge section 31E so that the mask portion 32 is replaceable.

FIG. 11A shows an example in which the frame portion 31 includes three frame holes 33. As shown in the example of FIG. 11B, the vapor deposition mask 30 may include one mask portion 32, which is common to the frame holes 33. The inner edge section 31E defining the frame hole 33A, the inner edge section 31E defining the frame hole 33B, and the inner edge section 31E defining the frame hole 33C are joined to the common mask portion 32.

The structure in which the quantity of the holes 32H required in one frame portion 31 is assigned to a single mask portion 32 involves only one mask portion 32 joined to the frame portion 31. This reduces the load required for joining between the frame portion 31 and the mask portion 32. In addition, a thicker mask plate 323 forming the mask portion 32 and larger holes 32H tend to increase the yield of the mask portion 32 and reduce the need for replacement of the mask portion 32. Thus, the structure in which the frame holes 33 shares the common mask portion 32 is particularly suitable for a vapor deposition mask 30 that requires low resolution.

[Method for Manufacturing Vapor Deposition Mask Substrate]

Figure 12:
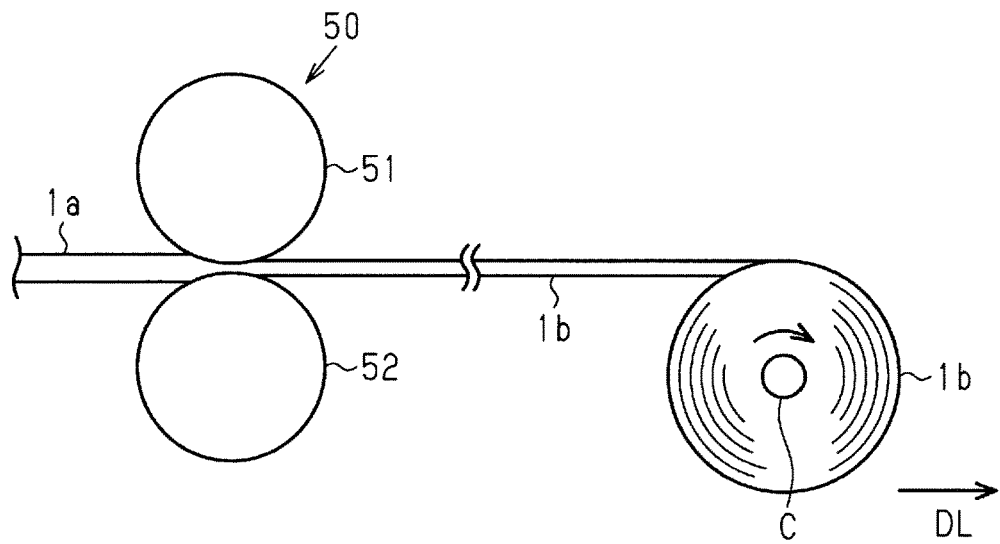
FIG. 12 is a process diagram showing a rolling step for manufacturing a vapor deposition mask substrate.
Figure 13:
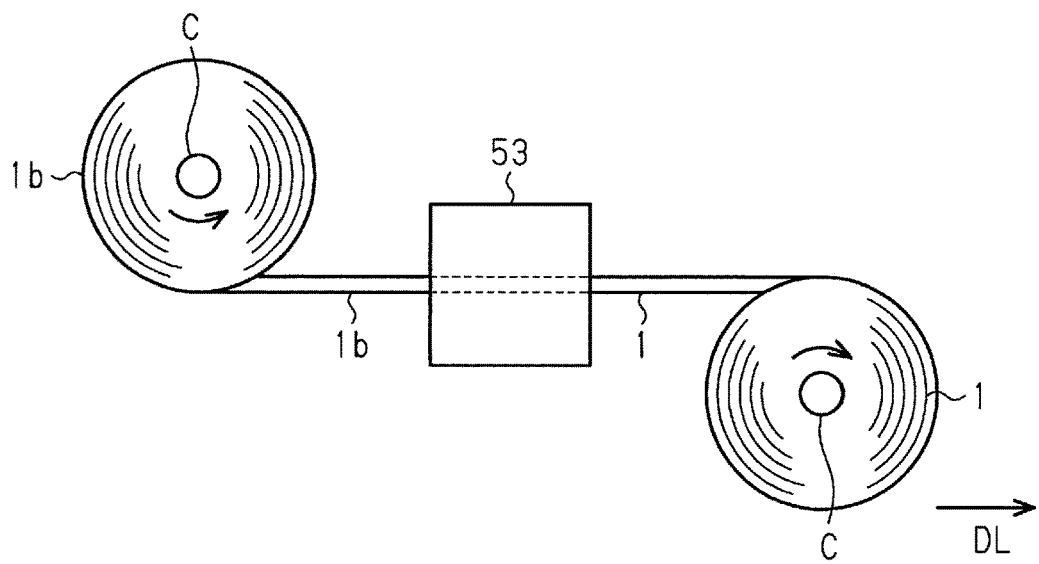
FIG. 13 is a process diagram showing a heating step for manufacturing a vapor deposition mask substrate.

Methods for manufacturing the vapor deposition mask substrate are now described. As methods for manufacturing a vapor deposition mask substrate, a method using rolling and a method using electrolysis are described separately. The method using rolling is first described, followed by the method using electrolysis. FIGS. 12 and 13 show an example using rolling.

Referring to FIG. 12, the method using rolling first prepares a base material 1a made of Invar, for example. The base material 1a extends in the longitudinal direction DL. Then, the base material 1a is transferred toward a rolling mill 50 such that the longitudinal direction DL of the base material 1a is parallel to the direction in which the base material 1a is transferred. The rolling mill 50 may include a pair of rolls 51 and 52, which rolls the base material 1a. This stretches the base material 1a in the longitudinal direction DL, forming a rolled material 1b. The rolled material 1b may be wound around a core C or handled in a state of being extended in the shape of a strip. The rolled material 1b has a thickness of between 10 µm and 50 µm inclusive, for example.

As shown in FIG. 13, the rolled material 1b is then transferred to an annealing apparatus 53. The annealing apparatus 53 heats the rolled material 1b that is being stretched in the longitudinal direction DL. This removes the residual stress remaining in the rolled material 1b and forms the vapor deposition mask substrate 1. The pressing force between the rolls 51 and 52, the rotation speed of the rolls 51 and 52, and the annealing temperature of the rolled material 1b are set to satisfy Conditions 1, 2 and 3.

In the method using electrolysis, the vapor deposition mask substrate 1 is formed on the surface of the electrode for electrolysis and then removed from the surface. When the vapor deposition mask substrate 1 is made of Invar, the electrolytic bath for electrolysis contains an iron ion source, a nickel ion source, and a pH buffer, for example. The electrolytic bath used for electrolysis may also contain a stress relief agent, an $Fe^{3+}$ ion masking agent, and a complexing agent, such as malic acid and citric acid, and is a weakly acidic solution having a pH adjusted for electrolysis. Examples of the iron ion source include ferrous sulfate heptahydrate, ferrous chloride, and ferrous sulfamate. Examples of the nickel ion source include nickel (II) sulfate, nickel (II) chloride, nickel sulfamate, and nickel bromide. Examples of the pH buffer include boric acid and malonic acid. Malonic acid also functions as an $Fe^{3+}$ ion masking agent. The stress relief agent may be saccharin sodium, for example. The electrolytic bath used for electrolysis may be an aqueous solution containing additives listed above and is adjusted using a pH adjusting agent, such as 5% sulfuric acid or nickel carbonate, to have a pH of between 2 and 3 inclusive, for example.

As the conditions for electrolysis, the temperature of the electrolytic bath, current density, and electrolysis time are adjusted according to the properties of the vapor deposition mask substrate 1, such as the thickness and composition ratio. The anode used in the electrolytic bath may be made of pure iron and nickel. The cathode used in the electrolytic bath may be a plate of stainless steel such as SUS304. The temperature of the electrolytic bath may be between 40° C. and 60° C. inclusive. The current density may be between 1 $A/dm^2$ and 4 $A/dm^2$ inclusive. The current density on the surface of the electrode is set to satisfy Conditions 1 to 3.

The vapor deposition mask substrate 1 produced by electrolysis and the vapor deposition mask substrate 1 produced by rolling may be further thinned by chemical or electrical polishing. The polishing solution used for chemical polishing may be a chemical polishing solution for an iron-based alloy that contains hydrogen peroxide as the main component. The electrolyte used for electrical polishing is a perchloric acid based electropolishing solution or a sulfuric acid based electropolishing solution. Since Conditions 1, 2 and 3 are satisfied, the surface of the vapor deposition mask substrate 1 has limited variation in the result of polishing using the polishing solution and the result of cleaning of the polishing solution using a cleaning solution.

[Method for Manufacturing Mask Portion]

Referring to FIGS. 14 to 19, a process for manufacturing the mask portion 32 shown in FIG. 7 is now described. The process for manufacturing the mask portion 32 shown in FIG. 6 is the same as the process for manufacturing the mask portion 32 shown in FIG. 7 except that the small holes 32SH are formed as through-holes and the step of forming large holes 32LH is omitted. The overlapping steps are not described.

Figure 14:
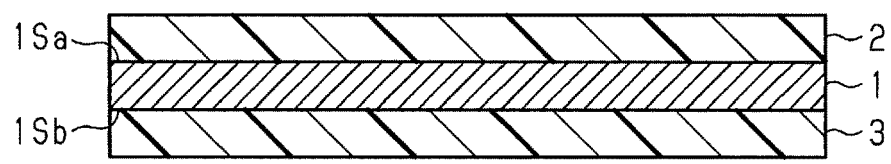
FIGS. 14 to 18 are process diagrams showing an etching step for manufacturing the mask portion.

Referring to FIG. 14, manufacturing of a mask portion starts with preparation of a vapor deposition mask substrate 1 including a first surface 1Sa and a second surface 1Sb, a first dry film resist 2 (a first DFR 2) to be affixed to the first surface 1Sa, and a second dry film resist 3 (a second DFR 3) to be affixed to the second surface 1Sb. The DFRs 2 and 3 are formed separately from the vapor deposition mask substrate 1. Then, the first DFR 2 is affixed to the first surface 1Sa, and the second DFR 3 is affixed to the second surface 1Sb.

Figure 15:
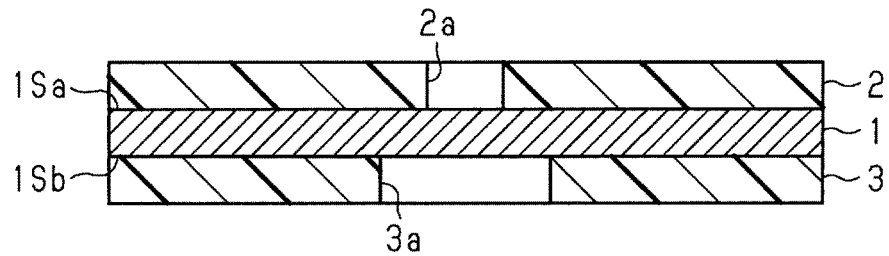

Referring to FIG. 15, the sections of the DFRs 2 and 3 other than the sections in which holes are to be formed are exposed to light, and then the DFRs are developed. This forms first through-holes 2a in the first DFR 2 and second through-holes 3a in the second DFR 3. The development of the exposed DFRs uses sodium carbonate solution, for example, as the developing solution. Since Conditions 1, 2 and 3 are satisfied, the surface of the vapor deposition mask substrate 1 has limited variation in the result of development using the developing solution and the result of cleaning using a cleaning solution. This increases the uniformity of the shape and size of the first and second through-holes 2a and 3a in the surface of the vapor deposition mask substrate 1.

Figure 16:
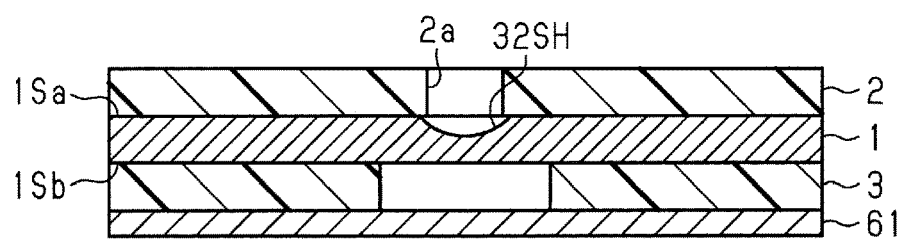

As shown in FIG. 16, the first surface 1Sa of the vapor deposition mask substrate 1 may be etched with ferric chloride solution using the developed first DFR 2 as the mask. Here, a second protection layer 61 is formed over the second surface 1Sb so that the second surface 1Sb is not etched together with the first surface 1Sa. The second protection layer 61 may be made of any material that chemically resists the ferric chloride solution. Small holes 32SH extending toward the second surface 1Sb are thus formed in the first surface 1Sa. Each small hole 32SH includes a first opening H1, which opens in the first surface 1Sa. Since Conditions 1, 2 and 3 are satisfied, the surface of the vapor deposition mask substrate 1 has limited variation in the result of etching using an etchant and the result of cleaning using a cleaning solution. This increases the uniformity of the shape and size of the small holes 32SH in the surface of the vapor deposition mask substrate 1.

The etchant for etching the vapor deposition mask substrate 1 may be an acidic etchant. When the vapor deposition mask substrate 1 is made of Invar, any etchant that is capable of etching Invar may be used. The acidic etchant may be a solution containing perchloric acid, hydrochloric acid, sulfuric acid, formic acid, or acetic acid mixed in a ferric perchlorate solution or a mixture of a ferric perchlorate solution and a ferric chloride solution. The vapor deposition mask substrate 1 may be etched by a dipping method that immerses the vapor deposition mask substrate 1 in an acidic etchant, or by a spraying method that that sprays an acidic etchant onto the vapor deposition mask substrate 1.

Figure 17:
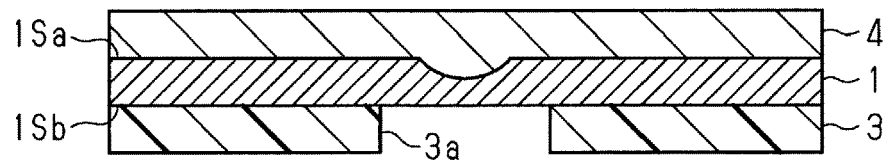

Referring to FIG. 17, the first DFR 2 formed on the first surface 1Sa and the second protection layer 61 on the second DFR 3 are removed. In addition, a first protection layer 4 is formed on the first surface 1Sa to prevent additional etching of the first surface 1Sa. The first protection layer 4 may be made of any material that chemically resists the ferric chloride solution.

Figure 18:
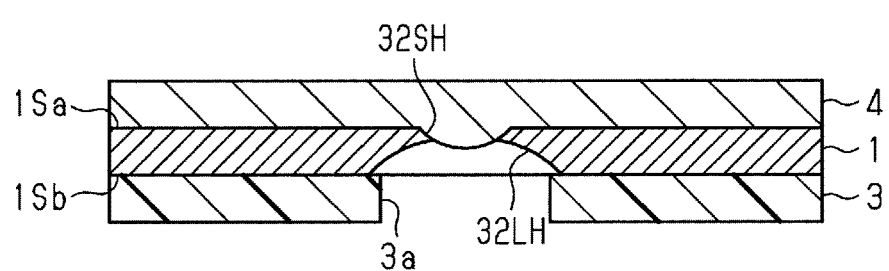

Then, as shown in FIG. 18, the second surface 1Sb is etched with ferric chloride solution using the developed second DFR 3 as the mask. Large holes 32LH extending toward the first surface 1Sa are thus formed in the second surface 1Sb. Each large hole 32LH has a second opening H2, which opens in the second surface 1Sb. The second openings H2 are larger than the first openings H1 in a plan view of the second surface 1Sb. Since Conditions 1, 2 and 3 are satisfied, the surface of the vapor deposition mask substrate 1 has limited variation in the result of etching using an etchant and the result of cleaning of the etchant using a cleaning solution. This increases the uniformity of the shape and size of the large holes 32LH in the surface of the vapor deposition mask substrate 1. The etchant used in this step may also be an acidic etchant. When the vapor deposition mask substrate 1 is made of Invar, any etchant that is capable of etching Invar may be used. The vapor deposition mask substrate 1 may also be etched by a dipping method that immerses the vapor deposition mask substrate 1 in an acidic etchant, or by a spraying method that sprays an acidic etchant onto the vapor deposition mask substrate 1.

Figure 19:
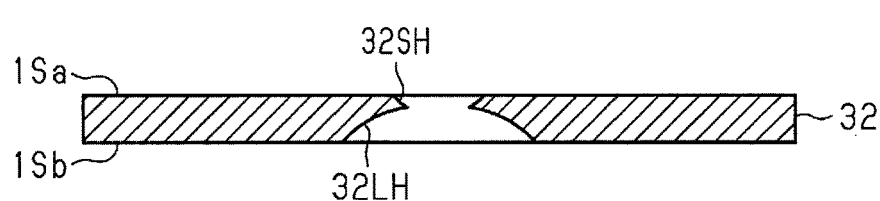
FIG. 19 is a process diagram showing an etching step for manufacturing a mask portion.

As shown in FIG. 19, removing the first protection layer 4 and the second DFR 3 from the vapor deposition mask substrate 1 provides the mask portion 32 having a plurality of small holes 32SH and large holes 32LH connected to the small holes 32SH.

In the manufacturing method using rolling, the vapor deposition mask substrate 1 includes some amount of a metallic oxide, such as an aluminum oxide or a magnesium oxide. That is, when the base material 1a is formed, a deoxidizer, such as granular aluminum or magnesium, is typically mixed into the material to limit mixing of oxygen into the base material 1a. The aluminum or magnesium remains to some extent in the base material 1a as a metallic oxide such as an aluminum oxide or a magnesium oxide. In this respect, the manufacturing method using electrolysis limits mixing of the metallic oxide into the mask portion 32.

[Method for Manufacturing Vapor Deposition Mask]

Various examples of a method for manufacturing a vapor deposition mask are now described. Referring to FIG. 20, an example of a method for forming holes by wet etching (the first manufacturing method) is described. Referring to FIG. 21, an example for a method of forming holes by electrolysis (the second manufacturing method) is described. Referring to FIG. 22, another example of a method for forming holes by electrolysis (the third manufacturing method) is described.

[First Manufacturing Method]

The method for manufacturing a vapor deposition mask including the mask portion 32 described with reference to FIG. 6 and the method for manufacturing a vapor deposition mask including the mask portion 32 described with reference to FIG. 7 involve substantially identical processes except for the step of etching a substrate 32K. The following description mainly focuses on the method for manufacturing a vapor deposition mask including the mask portion 32 shown in FIG. 6. The overlapping steps in the method for manufacturing a vapor deposition mask including the mask portion 32 shown in FIG. 7 are not described.

In the example of a method for manufacturing a vapor deposition mask shown in FIGS. 20A to 20H, a substrate 32K is first prepared (FIG. 20A). In addition to the vapor deposition mask substrate 1 described above, which is to be processed as a mask plate 323, the substrate 32K preferably includes a support SP, which supports the vapor deposition mask substrate 1. The first surface 321 of the substrate 32K (the lower surface in FIGS. 20A to 20H) corresponds to the first surface 1Sa described above, and the second surface 322 of the substrate 32K (the upper surface in FIGS. 20A to 20H) corresponds to the second surface 1Sb described above.

A resist layer PR is formed on the second surface 322 of the prepared substrate 32K (FIG. 20B), and the resist layer PR undergoes exposure and development so that a resist mask RM is formed on the second surface 322 (FIG. 20C). Holes 32H are then formed in the substrate 32K by wet etching from the second surface 322 using the resist mask RM (FIG. 20D).

In this step, second openings H2 are formed in the second surface 322, where the wet etching starts, and first openings H1 smaller than the second openings H2 are formed in the first surface 321, which is subjected to the wet etching after the second surface 322. The resist mask RM is then removed from the second surface 322, leaving the mask portion 32 described above (FIG. 20E). Finally, the outer edge sections 32E of the second surface 322 are joined to the inner edge sections 31E of a frame portion 31, and the support SP is removed from the mask portion 32 to complete the vapor deposition mask 30 (FIGS. 20F to 20H).

In the method for manufacturing a vapor deposition mask including the mask portion 32 shown in FIG. 7, the steps described above are performed on the surface of a substrate 32K corresponding to the first surface 321 to form small holes 32SH. This substrate 32K does not include a support SP. The small holes 32SH are then filled with a material for protecting the small holes 32SH, such as a resist. Then, the steps described above are performed on the surface of the substrate 32K corresponding to the second surface 322, thereby forming a mask portion 32.

The example shown in FIG. 20F uses resistance welding to join the outer edge sections 32E of the second surface 322 to the inner edge sections 31E of the frame portion 31. This method forms a plurality of holes SPH in an insulative support SP. The holes SPH are formed in the sections of the support SP that face the sections that become joining sections 32BN. Then, the joining sections 32BN are formed separately by energization through the holes SPH. This welds the outer edge sections 32E to the inner edge sections 31E.

The example shown in FIG. 20G uses laser welding to join the outer edge sections 32E of the second surface 322 to the inner edge sections 31E of the frame portion 31. This method uses a light transmitting support SP and irradiates the sections that become joining sections 32BN with laser light L through the support SP. Separate joining sections 32BN are formed by intermittently applying laser light L around the outer edge section 32E. Alternatively, a continuous joining section 32BN is formed along the entire circumference of the outer edge section 32E by continuously applying laser light L around the outer edge sections 32E. This welds the outer edge sections 32E to the inner edge sections 31E.

The example shown in FIG. 20H uses ultrasonic welding to join the outer edge sections 32E of the second surface 322 to the inner edge sections 31E of the frame portion 31. This method applies ultrasonic waves to the sections that become joining sections 32BN with the outer edge sections 32E and the inner edge sections 31E held together by clamps CP or other device. The member to which ultrasonic waves are directly applied may be the frame portion 31 or the mask portion 32. The method using ultrasonic welding leaves crimp marks of the clamps CP in the frame portion 31 and the support SP.

In the joining process described above, fusing or welding may be performed while stress is acting on the mask portion 32 outward of the mask portion 32. When the support SP supports the mask portion 32 while stress is acting on the mask portion 32 outward of the mask portion 32, the application of stress to the mask portion 32 may be omitted.

[Second Manufacturing Method]

In addition to the first manufacturing method, the vapor deposition masks described with reference to FIGS. 8 and 9 may be manufactured by another example shown in FIGS. 21A to 21E.

The example shown in FIGS. 21A to 21E first forms a resist layer PR on an electrode surface EPS, which is a surface of an electrode EP used for electrolysis (see FIG. 21A). Then, the resist layer PR undergoes exposure and development so that a resist mask RM is formed on the electrode surface EPS (see FIG. 21B). The resist mask RM includes the shape of a reverse truncated cone in a cross-section perpendicular to the electrode surface EPS. The cross-sectional area of each shape along the electrode surface EPS increases away from the electrode surface EPS. Then, electrolysis is performed using the electrode surface EPS having the resist mask RM, and a mask portion 32 is formed over the region on the electrode surface EPS other than the resist mask RM (FIG. 21C).

In this step, the mask portion 32 is formed in the space that is not occupied by the resist mask RM. Accordingly, the mask portion 32 includes holes shaped corresponding to the shape of the resist mask RM. Self-aligned holes 32H are thus formed in the mask portion 32. The surface in contact with the electrode surface EPS functions as the first surface 321 having the first openings H1, and the outermost surface having second openings H2, which are larger than the first openings H1, functions as the second surface 322.

Then, only the resist mask RM is removed from the electrode surface EPS, leaving holes 32H, which are hollows extending from the first openings H1 to the second openings H2 (see FIG. 21D). Finally, the joining surface 311 of the inner edge section 31E is joined to the outer edge section 32E of the second surface 322 including second openings H2, and then stress is applied to the frame portion 31 to peel off the mask portion 32 from the electrode surface EPS. The vapor deposition mask 30 in which the mask portion 32 is joined to the frame portion 31 is thus manufactured (FIG. 21E).

[Third Manufacturing Method]

In addition to the first manufacturing method, the vapor deposition masks described with reference to FIGS. 8 and 9 may be manufactured by another example shown in FIGS. 22A to 22F.

The example shown in FIGS. 22A to 22F first forms a resist layer PR on an electrode surface EPS, which is used for electrolysis (see FIG. 22A). Then, the resist layer PR undergoes exposure and development so that a resist mask RM is formed on the electrode surface EPS (see FIG. 22B). The resist mask RM includes the shape of a truncated cone in a cross-section perpendicular to the electrode surface EPS. The cross-sectional area of each shape along the electrode surface EPS decreases away from the electrode surface EPS. Then, electrolysis is performed using the electrode surface EPS having the resist mask RM, and a mask portion 32 is formed over the region on the electrode surface EPS other than the resist mask RM (FIG. 22C).

In this step, the mask portion 32 is formed in the space that is not occupied by the resist mask RM. Accordingly, the mask portion 32 includes holes shaped corresponding to the shape of the resist mask RM. Self-aligned holes 32H are thus formed in the mask portion 32. The surface in contact with the electrode surface EPS functions as the second surface 322 having the second openings H2, and the outermost surface having the first openings H1, which are smaller than the second openings H2, functions as the first surface 321.

Then, only the resist mask RM is removed from the electrode surface EPS, leaving holes 32H, which are hollows extending from the first openings H1 to the second openings H2 (see FIG. 22D). An intermediate transfer substrate TM is joined to the first surface 321 including the first openings H1, and stress is then applied to the intermediate transfer substrate TM to peel off the mask portion 32 from the electrode surface EPS. This separates the second surface 322 from the electrode surface EPS with the mask portion 32 joined to the intermediate transfer substrate TM (FIG. 22E). Finally, the joining surface 311 of the inner edge section 31E is joined to the outer edge section 32E of the second surface 322, and then the intermediate transfer substrate TM is removed from the mask portion 32. The vapor deposition mask 30 in which the mask portion 32 is joined to the frame portion 31 is thus manufactured (FIG. 22F).

In the method for manufacturing a display device using the vapor deposition mask 30 described above, the mask device 10 to which the vapor deposition mask 30 is mounted is set in the vacuum chamber of the vapor deposition apparatus. The mask device 10 is attached such that the first surface 321 faces the vapor deposition target, such as a glass substrate, and the second surface 322 faces the vapor deposition source. Then, the vapor deposition target is transferred into the vacuum chamber of the vapor deposition apparatus, and the vapor deposition material is sublimated from the vapor deposition source. This forms a pattern that is shaped corresponding to the first opening H1 on the vapor deposition target, which faces the first opening H1. The vapor deposition material may be an organic light-emitting material for forming pixels of a display device, or a pixel electrode for forming a pixel circuit of a display device, for example.

EXAMPLES

Referring to FIGS. 23 to 29, Examples are now described.

Example 1

A base material 1a, which was made of Invar, was subjected to a rolling step to form a metal sheet. The metal sheet was subjected to a slitting step of cutting the metal sheet into sections of the desired dimension in the width direction DW to form a rolled material 1b. The rolled material 1b was annealed to form a vapor deposition mask substrate 1 of Example 1, which had a length in the width direction DW of 500 mm and a thickness of 20 μm.

Figure 23:
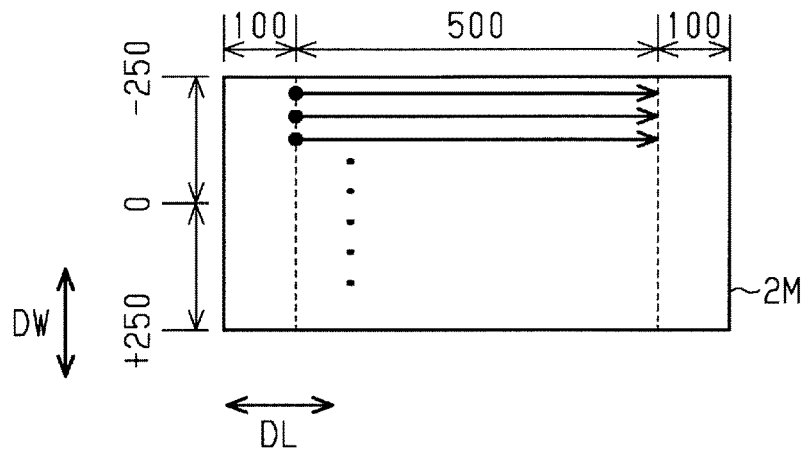
FIG. 23 is a plan view showing the planar structure of a measurement substrate of an example together with dimensions.

Referring to FIG. 23, a measurement substrate 2M of Example 1 having a length in the longitudinal direction DL of 700 mm was cut out from the vapor deposition mask substrate 1 of Example 1. Then, the steepnesses of the obtained measurement substrate 2M were measured over the entire range in the width direction DW of the measurement substrate 2M. The measurement conditions of steepnesses were as follows.

Measurement device: CNC image measurement system VMR-6555 manufactured by Nikon Corporation Length in the longitudinal direction DL of measurement area ZL: 500 mm Length in the longitudinal direction DL of non-measurement area ZE: 100 mm Measurement interval in the longitudinal direction DL: 1 mm Measurement interval in the width direction DW: 20 mm FIG. 24 and Table 1 show the measurement result of the steepnesses of Example 1. Table 1 shows the maximum values of the steepnesses in the center section RC and edge sections RE.

Figure 24:
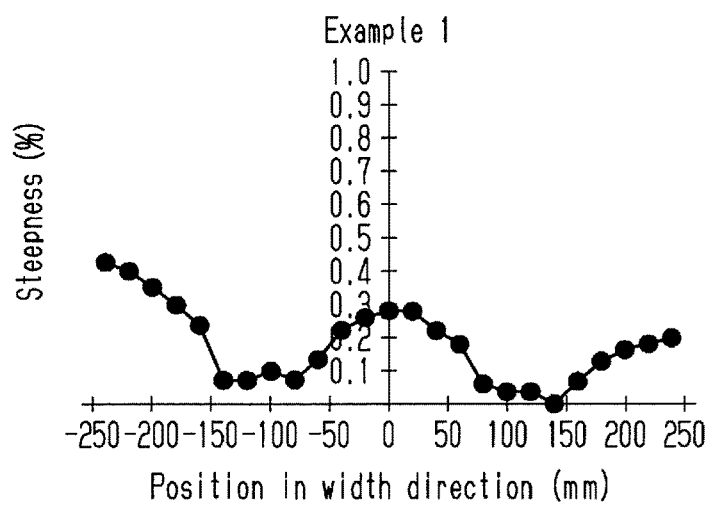
FIG. 24 is a graph showing the steepnesses of Example 1 at different positions in the width direction.

As shown in FIG. 24, the maximum value of the steepnesses in the center section RC of Example 1 was less than or equal to 0.3%, and the maximum values of the steepnesses in the edge sections RE were less than or equal to 0.6%, indicating that Example 1 satisfied Conditions 1 and 2 described above. In Example 1, the maximum value of the steepnesses in one of the two edge sections RE (the edge section 1) was 0.43% and greater than the maximum value of the steepnesses in the center section RC (0.28%). The maximum value of the steepnesses in the other edge section RE (the edge section 2) was 0.20% and less than the steepnesses in the center section RC. That is, Condition 3 described above was satisfied. The difference between the maximum values of the steepnesses in the edge sections RE was 0.23%.

Example 2

The vapor deposition mask substrate 1 of Example 2 having a length in the width direction DW of 500 mm and a thickness of 15 μm was obtained under the same conditions as Example 1 except that the pressing force between the rolls 51 and 52 was higher than that in Example 1. A measurement substrate 2M was cut out from the vapor deposition mask substrate 1 of Example 2 in the same manner as Example 1, and the steepnesses of the obtained measurement substrate 2M were measured over the entire range in the width direction DW of the measurement substrate 2M.

Figure 25:
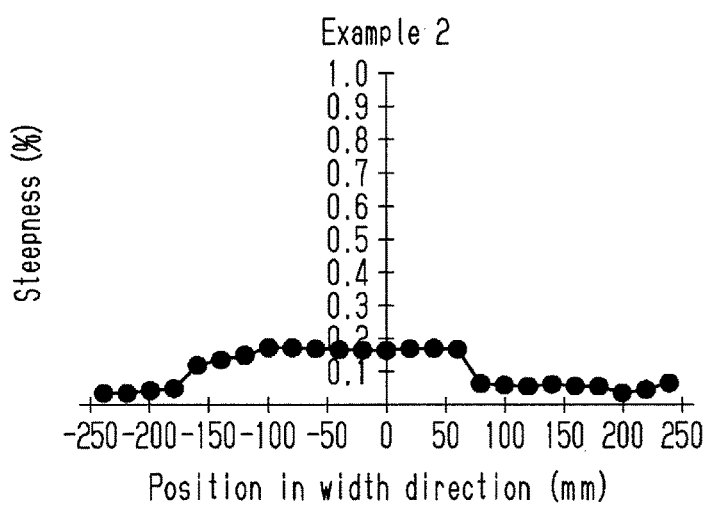
FIG. 25 is a graph showing the steepnesses of Example 2 at different positions in the width direction.

FIG. 25 and Table 1 show the measurement result of the steepnesses of Example 2.

As shown in FIG. 25, the maximum value of the steepnesses in the center section RC of Example 2 was less than or equal to 0.3%, and the maximum values of the steepnesses in the edge sections RE were less than or equal to 0.6%, indicating that Example 2 satisfied Conditions 1 and 2 described above. In Example 2, the maximum values of the steepnesses in the edge sections RE were 0.15% and 0.06% and less than the maximum value of the steepnesses in the center section RC (0.17%), indicating that Example 2 satisfied Condition 3.

Example 3

A vapor deposition mask substrate 1 of Example 3 having a length in the width direction DW of 500 mm and a thickness of 15 μm was obtained under the same conditions as Example 1 except that the pressing force between the rolls 51 and 52 was higher than that in Example 1 and distributed in a manner different from that in Example 2. A measurement substrate 2M was cut out from the vapor deposition mask substrate 1 of Example 3 in the same manner as Example 1, and the steepnesses of the obtained measurement substrate 2M were measured over the entire range in the width direction DW of the measurement substrate 2M.

Figure 26:
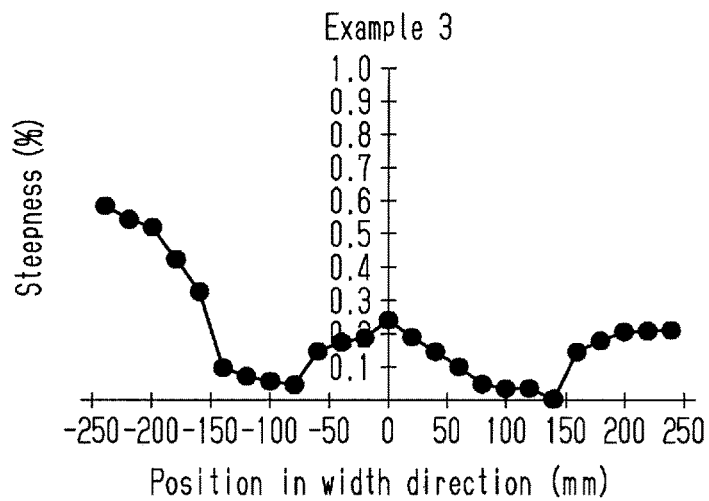
FIG. 26 is a graph showing the steepnesses of Example 3 at different positions in the width direction.

FIG. 26 and Table 1 show the measurement result of the steepnesses of Example 3.

As shown in FIG. 26, the maximum value of the steepnesses in the center section RC of Example 3 was less than or equal to 0.3%, and the maximum values of the steepnesses in the edge sections RE were less than or equal to 0.6%, indicating that Example 3 satisfied Conditions 1 and 2 described above. In Example 3, the maximum value of the steepnesses in one of the two edge sections RE (the edge section 1) was 0.58% and greater than the maximum value of the steepnesses in the center section RC (0.24%). The maximum value of the steepnesses in the other edge section RE (the edge section 2) was 0.21% and less than the maximum value of the steepnesses in the center section RC. That is, Condition 3 described above was satisfied. The difference between the maximum values of the steepnesses in the edge sections RE was 0.37%.

Comparison Example 1

A vapor deposition mask substrate 1 of Comparison Example 1 having a length in the width direction DW of 500 mm and a thickness of 20 μm was obtained under the same conditions as Example 1 except that the pressing force between the rolls 51 and 52 and the rotation speed of the rolls 51 and 52 were greater than those in Example 1. A measurement substrate 2M was cut out from the vapor deposition mask substrate 1 of Comparison Example 1 in the same manner as Example 1, and the surface distances of the obtained measurement substrate 2M were measured over the entire range in the width direction DW of the measurement substrate 2M to determine steepnesses of the measurement substrate 2M of Comparison Example 1.

Figure 27:
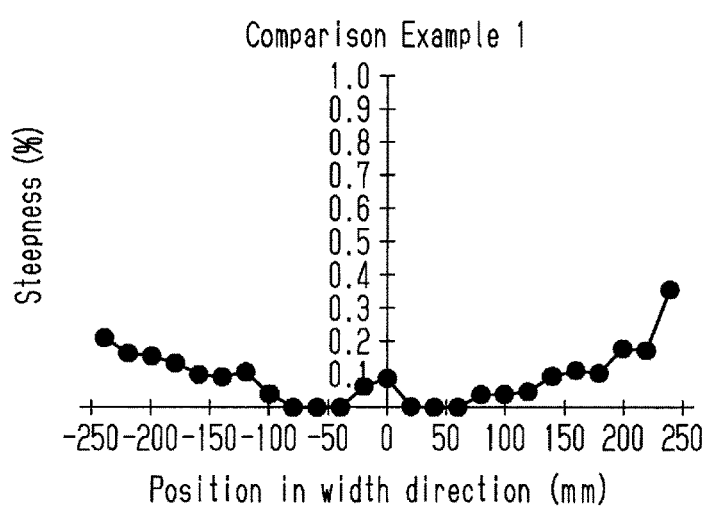
FIG. 27 is a graph showing the steepnesses of Comparison Example 1 at different positions in the width direction.

FIG. 27 and Table 1 show the measurement result of the steepnesses of Comparison Example 1.

As shown in FIG. 27, the maximum value of the steepnesses in the center section RC of Comparison Example 1 was less than or equal to 0.3%, and the maximum values of the steepnesses in the edge sections RE were less than or equal to 0.6%, indicating that Comparison Example 1 satisfied Conditions 1 and 2 described above. In Comparison Example 1, the maximum values of the steepnesses in the edge sections RE were 0.21% and 0.36% and greater than the maximum value of the steepnesses in the center section RC (0.08%), indicating that Comparison Example 1 failed to satisfy Condition 3.

Comparison Example 2

A vapor deposition mask substrate 1 of Comparison Example 2 having a length in the width direction DW of 500 mm and a thickness of 20 μm was obtained under the same conditions as Comparison Example 1 except that the pressing force between the rolls 51 and 52 was distributed in a manner different from that in Comparison Example 1. A measurement substrate 2M was cut out from the vapor deposition mask substrate 1 of Comparison Example 2 in the same manner as Comparison Example 1, and the steepnesses of the obtained measurement substrate 2M were measured over the entire range in the width direction DW.

Figure 28:
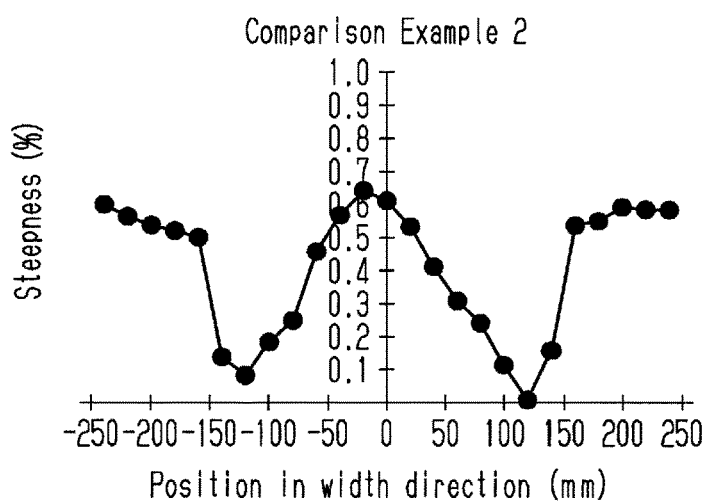
FIG. 28 is a graph showing the steepnesses of Comparison Example 2 at different positions in the width direction.

FIG. 28 and Table 1 show the measurement result of the steepnesses of Comparison Example 2

As shown in FIG. 28, the maximum value of the steepnesses in the center section RC of Comparison Example 2 was significantly greater than 0.3%, and the maximum values of the steepnesses in the edge sections RE were less than or equal to 0.6%, indicating that Comparison Example 2 satisfied Condition 2 but failed to satisfy Condition 1. In Comparison Example 2, the maximum values of the steepnesses in the edge sections RE were 0.59% and 0.58% and less than the maximum value of the steepnesses in the center section RC (0.63%), indicating that Comparison Example 2 satisfied Condition 3.

Comparison Example 3

A vapor deposition mask substrate 1 of Comparison Example 3 having a length in the width direction DW of 500 mm and a thickness of 20 μm was obtained under the same conditions as Comparison Example 1 except that the pressing force between the rolls 51 and 52 was distributed in a manner different from that in Comparison Example 1. A measurement substrate 2M was cut out from the vapor deposition mask substrate 1 of Comparison Example 3 in the same manner as Comparison Example 1, and the steepnesses of the obtained measurement substrate 2M were measured over the entire range in the width direction DW.

Figure 29:
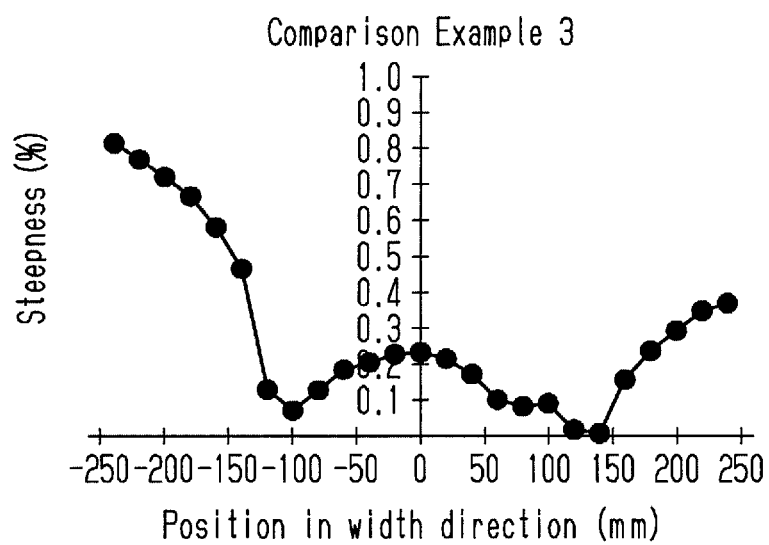
FIG. 29 is a graph showing the steepnesses of Comparison Example 3 at different positions in the width direction.

FIG. 29 and Table 1 show the measurement result of the steepnesses of Comparison Example 3.

As shown in FIG. 29, the maximum value of the steepnesses in the center section RC of the Comparison Example 3 was less than or equal to 0.3%, the maximum value of the steepnesses in one of the edge sections RE (the edge section 1) was significantly greater than 0.6%, and the maximum value of the steepnesses in the other edge section (the edge section 2) was less than or equal to 0.6%. That is, Comparison Example 3 satisfied Condition 1 but failed to satisfy Condition 2. In Comparison Example 3, the maximum values of the steepnesses in the edge sections RE were 0.81% and 0.36% and greater than the maximum value of the steepnesses in the center section RC. That is, Condition 3 described above was not satisfied.

TABLE 1

| | | Steepness | | | |
| | | Edge Section 1 | Center Section | Edge Section 2 | |
| | Thicknes | % | | | Variation |
| Example 1 | 20 μm | 0.43 | 0.28 | 0.20 | ○ |
| Example 2 | 15 μm | 0.15 | 0.17 | 0.06 | ○ |
| Example 3 | 15 μm | 0.58 | 0.24 | 0.21 | ○ |
| Comparison Example 1 | 20 μm | 0.21 | 0.08 | 0.36 | X |
| Comparison Example 2 | 20 μm | 0.59 | 0.63 | 0.58 | X |
| Comparison Example 3 | 20 μm | 0.81 | 0.22 | 0.36 | X |

[Pattern Accuracy]

A first DFR 2 having a thickness of 10 μm was affixed to the first surface 1Sa of the vapor deposition mask substrate 1 of each of Examples 1 to 3 and Comparison Examples 1 to 3. Each first DFR 2 underwent an exposure step, in which the first DFR 2 was exposed to light while in contact with an exposure mask, and a development step. This formed through-holes 2a having a diameter of 30 μm in the first DFR 2 in a grid pattern. Then, the first surface 1Sa was etched using the first DFR 2 as the mask so that holes 32H were formed in the vapor deposition mask substrate 1 in a grid pattern. The diameter of the opening of each hole 32H was measured in the width direction DW of the vapor deposition mask substrate 1. Table 1 shows the variations in diameter of the openings of the holes 32H in the width direction DW. In Table 1, the levels in which the difference between the maximum value and the minimum value of opening diameters of the holes 32H is less than or equal to 2.0 μm are marked with "o", and the levels in which the difference between the maximum value and the minimum value of opening diameters is greater than 2.0 μm are marked with "x".

As shown in Table 1, the variations in diameter of the openings of Examples 1 to 3 were less than or equal to 2.0 μm. In contrast, the variations in diameter of the openings of Comparison Examples 1 to 3 were greater than 2.0 μm.

Comparison Example 1 failed to satisfy Condition 3 because the maximum values of the steepnesses in the edge sections RE were greater than the maximum value of the steepnesses in the center section RC. Thus, Comparison Example 1 caused stagnation of a flow of liquid, resulting in the variation in diameter of the openings being greater than 2.0 μm, even though Conditions 1 and 2 were satisfied.

Comparison Example 2 satisfied Condition 3 because the maximum values of the steepnesses in the edge sections RE were less than the maximum value of the steepnesses in the center section RC. However, Comparison Example 2 failed to satisfy Condition 1 because the maximum value of the steepnesses in the center section RC was significantly greater than 0.3%. Even though Comparison Example 2 satisfied Conditions 2 and 3, some undulations in the center section RC were too high and caused stagnation of a flow of liquid on the center section RC, such as in valleys of undulations in the center section RC. This resulted in the variation in diameter of the openings being greater than 2.0 μm.

As was Comparison Example 1, Comparison Example 3 failed to satisfy Condition 3 because the maximum values of the steepnesses in the edge sections RE were greater than the maximum value of the steepnesses in the center section RC. Comparison Example 3 also failed to satisfy Condition 2 because the maximum value of the steepnesses in one of the edge sections RE was significantly greater than 0.6%. In Comparison Example 3, even though Condition 1 was satisfied, factors including the stagnation of a flow of liquid, peeling of the resist layer, displacement of exposure of the resist layer, and deviations in transfer of the vapor deposition mask substrate 1 resulted in the variation in diameter of the openings being greater than 2.0 μm.

The comparison between Examples 1 to 3 and Comparison Example 1 shows that a structure in which the maximum value of the steepnesses in at least one of the edge sections RE in the width direction DW is less than the maximum value of the steepnesses in the center section RC in the width direction DW, that is, a structure that satisfies Condition 3, limits variation in diameter of the openings. In other words, even if a vapor deposition mask substrate 1 has small maximum values of steepnesses and satisfies Conditions 1 and 2, failure to satisfy Condition 3 leads to variation in diameter of the openings due to factors including the substantially uneven distribution of the steepnesses, that is, the stagnation of a flow of liquid.

The comparison between Examples 1 to 3 and Comparison Examples 2 and 3 shows that a structure that satisfies Condition 3 has the advantage described above only when the maximum value of the steepnesses in the center section RC is less than or equal to 0.3% and the maximum values of the steepnesses in the edge sections RE are less than or equal to 0.6%, that is, only when the structure satisfies Conditions 1 and 2. In other words, even if a vapor deposition mask substrate 1 has a suitable distribution of the maximum values of steepnesses and satisfies Condition 3, failure to satisfy Conditions 1 and 2 leads to variation in diameter of the openings due to the presence of undulations with excessive steepness.

The above-described embodiment has the following advantages.

(1) The increased accuracy of the shape and size of the holes in the mask portion 32 increases the accuracy of the pattern formed by vapor deposition. The method for exposing the resist is not limited to a method of bringing the exposure mask into contact with the resist. The exposure may be performed without bringing the resist into contact with the exposure mask. Bringing the resist into contact with the exposure mask presses the vapor deposition mask substrate onto the surface of the exposure mask. This limits reduction in the accuracy of exposure, which would otherwise occur due to the undulated shape of the vapor deposition mask substrate. The accuracy in the step of processing the surface with liquid is increased regardless of the exposure method, thereby increasing the accuracy of the pattern formed by vapor deposition.

(2) The surface of the vapor deposition mask substrate 1 has limited variation in the result of development using a developing solution and the result of cleaning using a cleaning solution. This increases the consistency of the shape and size of the first and second through-holes 2a and 3a, which are formed by the exposure step and the development step, in the surface of the vapor deposition mask substrate 1.

(3) The surface of the vapor deposition mask substrate 1 has limited variation in the result of etching using an etchant and the result of cleaning of the etchant using a cleaning solution. The surface of the vapor deposition mask substrate 1 has limited variation in the result of stripping of the resist layer using a stripping solution and the result of cleaning of the stripping solution using a cleaning solution. This increases the consistency of the shape and size of the small holes 32SH and the large holes 32LH in the surface of the vapor deposition mask substrate 1.

(4) The quantity of holes 32H required in one frame portion 31 is divided into three mask portions 32. That is, the total area of the mask portions 32 required in one frame portion 31 is divided into three mask portions 32, for example. Thus, any partial deformation of a mask portion 32 in a frame portion 31 does not require replacement of all mask portions 32 in the frame portion 31. As compared with a structure in which one frame portion 31 includes only one mask portion 32, the size of a new mask portion 32 for replacing the deformed mask portion 32 may be reduced to about one-third.

(5) The steepnesses of each measurement substrate 2M are measured with the sections at the two edges in the longitudinal direction DL of the measurement substrate 2M excluded as non-measurement areas ZE from the measurement target of steepnesses. Each non-measurement area ZE is the area that can have an undulated shape that is formed when the vapor deposition mask substrate 1 is cut and is thus differs from the undulated shape of the other section of the vapor deposition mask substrate 1. As such, excluding the non-measurement area ZE from the measurement target will increase the accuracy of measurement of steepnesses.

The above-described embodiment may be modified as follows.

[Method for Manufacturing Vapor Deposition Mask Substrate]

In the rolling step, a rolling mill may be used that includes a plurality of pairs of rolls, which rolls the base material 1a. The method using a plurality of pairs of rolls increases the flexibility in terms of the control parameters for satisfying Conditions 1 to 3.

Further, instead of annealing the rolled material 1b while extending it in the longitudinal direction DL, the rolled material 1b may be annealed in a state of being wound around the core C in a roll. When the annealing is performed on the rolled material 1b wound in a roll, the vapor deposition mask substrate 1 may have the tendency for warpage according to the diameter of the roll. Thus, depending on the material of the vapor deposition mask substrate 1 and the diameter of the roll wound around the core C, it may be preferable that the rolled material 1b be annealed while extended.

Further, the rolling step and the annealing step may be repeated and alternate to produce a vapor deposition mask substrate 1.

The vapor deposition mask substrate 1 produced by electrolysis and the vapor deposition mask substrate 1 produced by rolling may be further thinned by chemical or electrical polishing. The conditions such as the composition and the supplying method of the polishing solution may be set so as to satisfy Conditions 1 to 3 after polishing.

[Center Section RC and Edge Sections RE]

The length in the width direction DW of the center section RC is preferably 40% of the length in the width direction DW of the vapor deposition mask substrate 1. However, the length in the width direction DW of the center section RC may be between 20% and 60% inclusive of the length in the width direction DW of the vapor deposition mask substrate 1.

The length in the width direction DW of each edge section RE is preferably 30% of the length in the width direction DW of the vapor deposition mask substrate 1. However, the length in the width direction DW of each edge section RE may be between 20% and 40% inclusive of the length in the width direction DW of the vapor deposition mask substrate 1. Further, the edge sections RE may have mutually different lengths within this range.

Although the multiple embodiments have been described herein, it will be clear to those skilled in the art that the present disclosure may be embodied in different specific forms without departing from the spirit of the disclosure. The disclosure is not to be limited to the details given herein, but may be modified within the scope and equivalence of the appended claims.

The invention claimed is:

1. A vapor deposition mask substrate, comprising:
   a metal sheet that has a shape of a strip and is configured to be etched to include a plurality of holes and used to manufacture a vapor deposition mask, wherein
   the metal sheet has a longitudinal direction and a width direction,
   the metal sheet has shapes in the longitudinal direction that are taken at different positions in the width direction of the metal sheet and differ from one another,
   each shape includes undulations repeating in the longitudinal direction,
   each undulation includes a valley at each end of the undulation,
   each undulation has a length, which is a length of a straight line that connects one of the valleys of the undulation to the other,
   a percentage of a height of each undulation with respect to the length of the undulation is a unit steepness,
   a steepness is an average value of unit steepnesses of all undulations in the longitudinal direction at each of the different positions in the width direction of the metal sheet,
   a maximum value of steepnesses in a center section in the width direction is less than or equal to 0.3%,
   a maximum value of steepnesses in a first edge section in the width direction and a maximum value of steepnesses in a second edge section in the width direction are less than or equal to 0.6%, and
   the maximum value of steepnesses in the first edge section and the maximum value of steepnesses in the second edge section in the width direction are less than the maximum value of steepnesses in the center section in the width direction.

2. The vapor deposition mask substrate according to claim 1, wherein
   the maximum value of steepnesses in the first edge section, the maximum value of steepnesses in the second edge section, and the maximum value of steepnesses in the center section are less than or equal to 0.2%.

3. A method for manufacturing the vapor deposition mask substrate according to claim 1, comprises the metal sheet that has a shape of a strip and is configured to be etched to include a plurality of holes and used to manufacture a vapor deposition mask, the method comprising:
   obtaining the metal sheet by rolling a base material, wherein
   the obtained metal sheet has a longitudinal direction and a width direction,
   the obtained metal sheet has shapes in the longitudinal direction that are taken at different positions in the width direction and differ from one another,
   each shape includes undulations repeating in the longitudinal direction,
   each undulation includes a valley at each end of the undulation,
   each undulation has a length, which is a length of a straight line that connects one of the valleys of the undulation to the other,
   a percentage of a height of each undulation with respect to the length of the undulation is a unit steepness,
   a steepness is an average value of unit steepnesses of all undulations in the longitudinal direction at each of the different positions in the width direction of the obtained metal sheet,
   a maximum value of steepnesses in a center section in the width direction is less than or equal to 0.3%,
   a maximum value of steepnesses in a first edge section in the width direction and a maximum value of steepnesses in a second edge section in the width direction are less than or equal to 0.6%, and
   the maximum value of steepnesses in the first edge section and the maximum value of steepnesses in the second edge section in the width direction are less than the maximum value of steepnesses in the center section in the width direction.

4. A method for manufacturing a vapor deposition mask, the method comprising:
   forming a resist layer on the vapor deposition mask substrate according to claim 1, comprising the metal sheet having a shape of a strip; and forming a plurality of holes in the metal sheet by etching using the resist layer as a mask to form a mask portion in the metal sheet, wherein the metal sheet has a longitudinal direction and a width direction, the metal sheet has shapes in the longitudinal direction that are taken at different positions in the width direction and differ from one another, each shape includes undulations repeating in the longitudinal direction, each undulation includes a valley at each end of the undulation, each undulation has a length, which is a length of a straight line that connects one of the valleys of the undulation to the other, a percentage of a height of each undulation with respect to the length of the undulation is a unit steepness, a steepness is an average value of unit steepnesses of all undulations in the longitudinal direction at each of the different positions in the width direction of the metal sheet, a maximum value of steepnesses in a center section in the width direction is less than or equal to 0.3%, a maximum value of steepnesses in a first edge section in the width direction and a second edge section in the width direction are less than or equal to 0.6%, and the maximum value of steepnesses in the first edge section and the maximum value of steepnesses in the second edge section in the width direction are less than the maximum value of steepnesses in the center section in the width direction.

5. The method according to claim 4, wherein the mask portion is one of a plurality of mask portions, forming the mask portion includes forming the mask portions in the single metal sheet, the mask portions each include a side surface including some of the holes, and the method further comprises joining the side surfaces of the mask portions to a single frame portion such that the frame portion surrounds the holes.

6. A method for manufacturing a display device, the method comprising:

preparing a vapor deposition mask manufactured by the method according to claim 4; and forming a pattern by vapor deposition using the vapor deposition mask.

* * * * *